(12) United States Patent
Wu et al.

(10) Patent No.: US 11,289,542 B2
(45) Date of Patent: *Mar. 29, 2022

(54) MULTI-LAYERED CONDUCTIVE METAL OXIDE STRUCTURES AND METHODS FOR FACILITATING ENHANCED PERFORMANCE CHARACTERISTICS OF TWO-TERMINAL MEMORY CELLS

(71) Applicant: HEFEI RELIANCE MEMORY LIMITED, Hefei (CN)

(72) Inventors: Jian Wu, San Jose, CA (US); Rene Meyer, Atherton, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/117,632

(22) Filed: Dec. 10, 2020

(65) Prior Publication Data

US 2021/0098534 A1  Apr. 1, 2021

Related U.S. Application Data

(63) Continuation of application No. 16/705,077, filed on Dec. 5, 2019, now Pat. No. 11,037,987, which is a (Continued)

(51) Int. Cl.
  *H01L 27/24* (2006.01)
  *H01L 45/00* (2006.01)

(52) U.S. Cl.
  CPC ...... *H01L 27/2463* (2013.01); *H01L 27/2418* (2013.01); *H01L 27/2481* (2013.01);
  (Continued)

(58) Field of Classification Search
  CPC ....... H01L 45/08; H01L 45/085; H01L 45/12; H01L 45/1233; H01L 45/1246;
  (Continued)

(56) References Cited

U.S. PATENT DOCUMENTS 3,886,577 A  5/1975  Buckley
4,519,032 A  5/1985  Mendell
(Continued)

FOREIGN PATENT DOCUMENTS

EP  1376598 A1  1/2004
EP  1376598 B1  6/2006
(Continued)

OTHER PUBLICATIONS

U.S. Appl. No. 60/536,115, filed Jan. 12, 2004 in the name of Yong CHEN.
(Continued)

*Primary Examiner* — Allison Bernstein
(74) *Attorney, Agent, or Firm* — Sheppard Mullin Richter & Hampton LLP

(57) ABSTRACT

A memory cell including a two-terminal re-writeable non-volatile memory element having at least two layers of conductive metal oxide (CMO), which, in turn, can include a first layer of CMO including mobile oxygen ions, and a second layer of CMO formed in contact with the first layer of CMO to cooperate with the first layer of CMO to form an ion obstruction barrier. The ion obstruction barrier is configured to inhibit transport or diffusion of a subset of mobile ion to enhance, among other things, memory effects and cycling endurance of memory cells. At least one layer of an insulating metal oxide that is an electrolyte to the mobile oxygen ions and configured as a tunnel barrier is formed in contact with the second layer of CMO.

19 Claims, 12 Drawing Sheets

Related U.S. Application Data continuation of application No. 16/219,219, filed on Dec. 13, 2018, now Pat. No. 10,535,714, which is a continuation of application No. 15/811,179, filed on Nov. 13, 2017, now Pat. No. 10,186,553, which is a continuation of application No. 15/338,857, filed on Oct. 31, 2016, now Pat. No. 9,818,799, which is a continuation of application No. 14/453,982, filed on Aug. 7, 2014, now Pat. No. 9,484,533, which is a continuation of application No. 13/250,923, filed on Sep. 30, 2011, now abandoned.

(52) U.S. Cl.
CPC ............ *H01L 45/08* (2013.01); *H01L 45/085* (2013.01); *H01L 45/12* (2013.01); *H01L 45/1233* (2013.01); *H01L 45/1246* (2013.01); *H01L 45/1253* (2013.01); *H01L 45/146* (2013.01); *H01L 45/147* (2013.01); *H01L 45/165* (2013.01); *H01L 45/1616* (2013.01)

(58) Field of Classification Search
CPC ............ H01L 45/1253; H01L 45/1266; H01L 45/145–147; H01L 45/1616; H01L 45/165; H01L 27/2463; H01L 27/2418; H01L 27/2481
See application file for complete search history.

(56) References Cited

U.S. PATENT DOCUMENTS

| | | |
|---|---|---|
| 4,830,981 A | 5/1989 | Baglee |
| 4,843,059 A | 6/1989 | Deslandes |
| 5,160,987 A | 11/1992 | Pricer |
| 5,296,716 A | 3/1994 | Ovshinsky |
| 5,469,564 A | 11/1995 | Junya |
| 5,479,317 A | 12/1995 | Ramesh |
| 5,483,482 A | 1/1996 | Kamada et al. |
| 5,536,947 A | 7/1996 | Klersy et al. |
| 5,572,461 A | 11/1996 | Gonzalez |
| 5,625,587 A | 4/1997 | Peng et al. |
| 5,719,416 A | 2/1998 | Yoshimori et al. |
| 5,739,135 A | 4/1998 | Biller et al. |
| 5,767,115 A | 6/1998 | Rosenblum et al. |
| 5,789,320 A | 8/1998 | Andricacos |
| 5,835,396 A | 11/1998 | Zhang |
| 5,852,307 A | 12/1998 | Aoyama |
| 5,883,109 A | 3/1999 | Gregg et al. |
| 5,894,135 A | 4/1999 | Yamamoto |
| 5,985,757 A | 11/1999 | Lee et al. |
| 5,991,193 A | 11/1999 | Gallagher et al. |
| 6,005,810 A | 12/1999 | Wu |
| 6,026,042 A | 2/2000 | Shirley et al. |
| 6,034,882 A | 3/2000 | Johnson et al. |
| 6,128,214 A | 10/2000 | Kuekes et al. |
| 6,130,814 A | 10/2000 | Sun |
| 6,140,672 A | 10/2000 | Arita et al. |
| 6,185,121 B1 | 2/2001 | O'Neill |
| 6,185,122 B1 | 2/2001 | Johnson et al. |
| 6,194,454 B1 | 2/2001 | Dow |
| 6,204,139 B1 | 3/2001 | Liu et al. |
| 6,236,076 B1 | 5/2001 | Arita et al. |
| 6,256,220 B1 | 7/2001 | Kamp |
| 6,259,644 B1 | 7/2001 | Tran et al. |
| 6,326,671 B1 | 12/2001 | Nagano et al. |
| 6,351,406 B1 | 2/2002 | Johnson et al. |
| 6,370,056 B1 | 4/2002 | Chen |
| 6,385,074 B1 | 5/2002 | Johnson et al. |
| 6,407,953 B1 | 6/2002 | Cleeves |
| 6,420,215 B1 | 7/2002 | Knall et al. |
| 6,458,621 B1 | 10/2002 | Beck |
| 6,459,095 B1 | 10/2002 | Heath et al. |
| 6,473,332 B1 | 10/2002 | Ignatiev et al. |
| 6,475,812 B2 | 11/2002 | Nickel |
| 6,487,106 B1 | 11/2002 | Kozicki |
| 6,504,753 B1 | 1/2003 | Scheuerlein et al. |
| 6,515,888 B2 | 2/2003 | Johnson et al. |
| 6,515,904 B2 | 2/2003 | Moore et al. |
| 6,518,156 B1 | 2/2003 | Chen |
| 6,522,594 B1 | 2/2003 | Scheuerlein |
| 6,525,953 B1 | 2/2003 | Johnson |
| 6,528,365 B2 | 3/2003 | Nagano et al. |
| 6,531,371 B2 | 3/2003 | Hsu |
| 6,534,403 B2 | 3/2003 | Cleeves |
| 6,534,784 B2 | 3/2003 | Eliasson |
| 6,545,891 B1 | 4/2003 | Tringali et al. |
| 6,545,898 B1 | 4/2003 | Scheuerlein |
| 6,563,185 B2 | 5/2003 | Moddel |
| 6,569,745 B2 | 5/2003 | Hsu |
| 6,580,120 B2 | 6/2003 | Haspeslagh |
| 6,599,796 B2 | 7/2003 | Mei et al. |
| 6,631,085 B2 | 10/2003 | Kleveland et al. |
| 6,635,603 B1 | 10/2003 | Batlogg |
| 6,642,539 B2 | 11/2003 | Ramesh et al. |
| 6,656,785 B2 | 12/2003 | Chiang |
| 6,657,888 B1 | 12/2003 | Doudin |
| 6,693,821 B2 | 2/2004 | Hsu et al. |
| 6,731,528 B2 | 5/2004 | Hush |
| 6,741,495 B2 | 5/2004 | Kunikiyo |
| 6,753,561 B1 | 6/2004 | Rinerson |
| 6,756,649 B2 | 6/2004 | Moddel |
| 6,759,249 B2 | 7/2004 | Zhuang et al. |
| 6,762,071 B2 | 7/2004 | Eliasson |
| 6,765,245 B2 | 7/2004 | Bansal |
| 6,674,054 B2 | 8/2004 | Zhang et al. |
| 6,777,248 B1 | 8/2004 | Nabatame et al. |
| 6,778,420 B2 | 8/2004 | Parkinson |
| 6,781,166 B2 | 8/2004 | Lieber |
| 6,784,517 B2 | 8/2004 | Kleveland |
| 6,788,576 B2 | 9/2004 | Roizin |
| 6,798,685 B2 | 9/2004 | Rinerson |
| 6,807,088 B2 | 10/2004 | Tsuchida |
| 6,816,410 B2 | 11/2004 | Kleveland et al. |
| 6,822,903 B2 | 11/2004 | Scheuerlein et al. |
| 6,825,058 B2 | 11/2004 | Hsu |
| 6,825,489 B2 | 11/2004 | Kozicki |
| 6,831,313 B2 | 12/2004 | Uchiyama |
| 6,834,013 B2 | 12/2004 | Fan |
| 6,836,421 B2 | 12/2004 | Rinerson et al. |
| 6,839,269 B2 | 1/2005 | Iwata et al. |
| 6,841,833 B2 | 1/2005 | Hsu |
| 6,849,564 B2 | 2/2005 | Hsu |
| 6,850,455 B2 | 2/2005 | Rinerson et al. |
| 6,855,647 B2 | 2/2005 | Beck |
| 6,856,536 B2 | 2/2005 | Rinerson |
| 6,859,382 B2 | 2/2005 | Rinerson et al. |
| 6,870,755 B2 | 3/2005 | Rinerson |
| 6,875,651 B2 | 4/2005 | Hsu |
| 6,882,553 B2 | 4/2005 | Nejad et al. |
| 6,884,812 B2 | 4/2005 | Glombick et al. |
| 6,903,361 B2 | 6/2005 | Gilton |
| 6,917,539 B2 | 7/2005 | Rinerson et al. |
| 6,927,430 B2 | 8/2005 | Hsu |
| 6,937,505 B2 | 8/2005 | Morikawa |
| 6,939,724 B2 | 9/2005 | Zhuang |
| 6,940,113 B2 | 9/2005 | Hsu et al. |
| 6,940,744 B2 | 9/2005 | Rinerson et al. |
| 6,965,137 B2 | 11/2005 | Kinney |
| 6,970,375 B2 | 11/2005 | Rinerson et al. |
| 6,970,391 B2 | 11/2005 | Watanabe et al. |
| 6,972,238 B2 | 12/2005 | Hsu |
| 6,972,427 B2 | 12/2005 | Roehr |
| 6,985,378 B2 | 1/2006 | Kozicki |
| 6,990,008 B2 | 1/2006 | Bednorz |
| 6,998,698 B2 | 2/2006 | Inoue |
| 6,999,339 B2 | 2/2006 | Tuttle et al. |
| 7,001,846 B2 | 2/2006 | Hsu |
| 7,002,197 B2 | 2/2006 | Perner |
| 7,005,717 B2 | 2/2006 | Eisenbeiser |
| 7,009,909 B2 | 3/2006 | Rinerson et al. |
| 7,020,006 B2 | 3/2006 | Chevallier et al. |
| 7,022,572 B2 | 4/2006 | Scheuerlein et al. |
| 7,023,743 B2 | 4/2006 | Nejad et al. |

(56) References Cited

U.S. PATENT DOCUMENTS

| | | |
|---|---|---|
| 7,026,693 B2 | 4/2006 | Shimizu |
| 7,029,924 B2 | 4/2006 | Hsu |
| 7,042,066 B2 | 5/2006 | Hsu |
| 7,046,550 B1 | 5/2006 | Reohr et al. |
| 7,057,914 B2 | 6/2006 | Rinerson et al. |
| 7,060,586 B2 | 6/2006 | Li |
| 7,067,862 B2 | 6/2006 | Rinerson |
| 7,068,533 B2 | 6/2006 | Ferrant |
| 7,075,817 B2 | 7/2006 | Rinerson et al. |
| 7,079,442 B2 | 7/2006 | Rinerson et al. |
| 7,082,052 B2 | 7/2006 | Rinerson |
| 7,098,043 B2 | 8/2006 | Zhuang |
| 7,105,852 B2 | 9/2006 | Moddel |
| 7,106,639 B2 | 9/2006 | Taussig et al. |
| 7,141,481 B2 | 11/2006 | Hsu et al. |
| 7,148,533 B2 | 12/2006 | Hsu |
| 7,149,107 B2 | 12/2006 | Rinerson et al. |
| 7,173,275 B2 | 2/2007 | Estes |
| 7,177,181 B1 | 2/2007 | Scheuerlein |
| 7,180,772 B2 | 2/2007 | Rinerson |
| 7,205,238 B2 | 4/2007 | Pan |
| 7,212,432 B2 | 5/2007 | Ferrant |
| 7,218,984 B1 | 5/2007 | Bayat |
| 7,227,774 B2 | 6/2007 | Tuttle et al. |
| 7,227,775 B2 | 6/2007 | Rinerson et al. |
| 7,235,454 B2 | 6/2007 | Kim |
| 7,256,415 B2 | 8/2007 | Furukawa et al. |
| 7,256,429 B2 | 8/2007 | Hsu et al. |
| 7,257,458 B1 | 8/2007 | Markle |
| 7,259,076 B2 | 8/2007 | Hsu |
| 7,271,063 B2 | 9/2007 | Chung-Zen |
| 7,272,067 B1 | 9/2007 | Huang |
| 7,283,403 B2 | 10/2007 | Johnson |
| 7,292,957 B1 | 11/2007 | Schell |
| 7,306,988 B1 | 12/2007 | Avanzino |
| 7,319,053 B2 | 1/2008 | Subramanian |
| 7,326,979 B2 | 2/2008 | Rinerson et al. |
| 7,327,600 B2 | 2/2008 | Norman |
| 7,327,753 B2 | 2/2008 | Raissinia et al. |
| 7,335,575 B2 | 2/2008 | Hsu |
| 7,337,149 B2 | 2/2008 | Blouin |
| 7,339,811 B2 | 3/2008 | Nejad et al. |
| 7,359,226 B2 | 4/2008 | Schwerin |
| 7,372,753 B1 | 5/2008 | Rinerson et al. |
| 7,379,364 B2 | 5/2008 | Siau et al. |
| 7,381,981 B2 | 6/2008 | Aitken |
| 7,388,276 B2 | 6/2008 | Estes |
| 7,394,679 B2 | 7/2008 | Rinerson et al. |
| 7,394,680 B2 | 7/2008 | Toda et al. |
| 7,400,006 B1 | 7/2008 | Rinerson |
| 7,405,960 B2 | 7/2008 | Cho et al. |
| 7,408,212 B1 | 8/2008 | Luan |
| 7,411,811 B2 | 8/2008 | Inoue |
| 7,417,271 B2 | 8/2008 | Genrikh et al. |
| 7,433,222 B2 | 10/2008 | Hosoi |
| 7,443,711 B1 | 10/2008 | Stewart et al. |
| 7,446,010 B2 | 11/2008 | Li |
| 7,457,147 B2 | 11/2008 | Rinerson et al. |
| 7,459,716 B2 | 12/2008 | Toda |
| 7,460,385 B2 | 12/2008 | Gruber |
| 7,462,857 B2 | 12/2008 | Arai |
| 7,463,546 B2 | 12/2008 | Fasoli et al. |
| 7,464,621 B2 | 12/2008 | Mathis et al. |
| 7,498,600 B2 | 3/2009 | Cho et al. |
| 7,505,344 B2 | 3/2009 | Scheuerlein |
| 7,508,695 B2 | 3/2009 | Sugita |
| 7,514,271 B2 | 4/2009 | Gaidis |
| 7,526,743 B2 | 4/2009 | Arp |
| 7,535,035 B2 | 5/2009 | Baek |
| 7,538,338 B2 | 5/2009 | Rinerson et al. |
| 7,554,873 B2 | 6/2009 | Lee |
| 7,558,099 B2 | 7/2009 | Morimoto |
| 7,569,459 B2 | 8/2009 | Karg |
| 7,573,753 B2 | 8/2009 | Atwood et al. |
| 7,577,022 B2 | 8/2009 | Muraoka |
| 7,593,284 B2 | 9/2009 | Norman |
| 7,606,086 B2 | 10/2009 | Inoue |
| 7,608,467 B2 | 10/2009 | Wu et al. |
| 7,633,108 B2 | 12/2009 | Li |
| 7,633,790 B2 | 12/2009 | Rinerson et al. |
| 7,639,521 B2 | 12/2009 | Baek et al. |
| 7,643,344 B2 | 1/2010 | Choi |
| 7,649,788 B2 | 1/2010 | Norman |
| 7,652,501 B2 | 1/2010 | Norman |
| 7,652,502 B2 | 1/2010 | Norman |
| 7,701,791 B2 | 4/2010 | Rinerson et al. |
| 7,706,177 B2 | 4/2010 | Petti |
| 7,715,244 B2 | 5/2010 | Norman |
| 7,715,250 B2 | 5/2010 | Norman |
| 7,719,876 B2 | 5/2010 | Chevallier et al. |
| 7,733,685 B2 | 6/2010 | Scheuerlein et al. |
| 7,742,323 B2 | 6/2010 | Rinerson et al. |
| 7,764,160 B2 | 7/2010 | Kawano |
| 7,778,061 B2 | 8/2010 | Robinett |
| 7,782,650 B2 | 8/2010 | Bertin et al. |
| 7,796,416 B2 | 9/2010 | Ishihara |
| 7,796,451 B2 | 9/2010 | Norman |
| 7,807,517 B2 | 10/2010 | Kim |
| 7,813,210 B2 | 10/2010 | Norman |
| 7,818,523 B2 | 10/2010 | Norman |
| 7,822,913 B2 | 10/2010 | Norman |
| 7,824,982 B2 | 11/2010 | Forbes |
| 7,832,090 B1 | 11/2010 | Bornstein |
| 7,842,991 B2 | 11/2010 | Cho et al. |
| 7,877,541 B2 | 1/2011 | Norman |
| 7,884,349 B2 | 2/2011 | Rinerson et al. |
| 7,889,539 B2 | 2/2011 | Rinerson et al. |
| 7,889,571 B2 | 2/2011 | Norman |
| 7,897,951 B2 | 3/2011 | Rinerson |
| 7,898,841 B2 | 3/2011 | Chevallier et al. |
| 7,902,861 B2 | 3/2011 | Coenen |
| 7,902,862 B2 | 3/2011 | How |
| 7,902,863 B1 | 3/2011 | Tetzlaff |
| 7,902,866 B1 | 3/2011 | Patterson |
| 7,902,867 B2 | 3/2011 | Mouttet |
| 7,902,868 B2 | 3/2011 | Norman |
| 7,902,869 B1 | 3/2011 | Carter |
| 7,910,913 B2 | 3/2011 | Choi |
| 7,920,408 B2 | 4/2011 | Azuma |
| 7,924,608 B2 | 4/2011 | Campbell |
| 7,929,345 B2 | 4/2011 | Issaq |
| 7,932,548 B2 | 4/2011 | Nagashima |
| 7,935,953 B2 | 5/2011 | Ahn |
| 7,955,871 B2 | 6/2011 | Wu et al. |
| 7,961,494 B2 | 6/2011 | Scheuerlein |
| 7,982,504 B1 | 7/2011 | Robinett |
| 7,983,065 B2 | 7/2011 | Samachisa |
| 7,985,963 B2 | 7/2011 | Rinerson et al. |
| 7,990,753 B2 | 8/2011 | Matsuo |
| 7,990,754 B2 | 8/2011 | Azuma |
| 7,995,371 B2 | 8/2011 | Rinerson |
| 7,999,307 B2 | 8/2011 | Kim |
| 8,003,511 B2 | 8/2011 | Rinerson |
| 8,031,509 B2 | 10/2011 | Schloss |
| 8,040,723 B2 | 10/2011 | Sheu et al. |
| 8,044,456 B2 | 10/2011 | Nagashima |
| 8,050,084 B2 | 11/2011 | Bae et al. |
| 8,062,942 B2 | 11/2011 | Rinerson et al. |
| 8,064,256 B2 | 11/2011 | Norman |
| 8,124,968 B2 | 2/2012 | Koo |
| 8,134,866 B2 | 3/2012 | Bae et al. |
| 8,139,409 B2 | 3/2012 | Chevallier et al. |
| 8,159,858 B2 | 4/2012 | Siau |
| 8,164,937 B2 | 4/2012 | Norman |
| 8,164,970 B2 | 4/2012 | Norman |
| 8,169,053 B2 | 5/2012 | Kim |
| 8,187,936 B2 | 5/2012 | Alsmeier |
| 8,198,618 B2 | 6/2012 | Mikawa |
| 8,207,613 B2 | 6/2012 | Okukawa |
| 8,208,284 B2 | 6/2012 | Schloss |
| 8,237,145 B2 | 8/2012 | Kamata |
| 8,264,864 B2 | 9/2012 | Meyer |
| 8,270,193 B2 | 9/2012 | Siau et al. |
| 8,317,910 B2 | 11/2012 | Cheung |

(56) References Cited

U.S. PATENT DOCUMENTS

| | | |
|---|---|---|
| 8,363,443 B2 | 1/2013 | Chevallier et al. |
| 8,390,100 B2 | 3/2013 | Bornstein |
| 8,427,868 B2 | 4/2013 | Chevallier et al. |
| 8,431,919 B2 | 4/2013 | Nansei |
| 8,482,958 B2 | 7/2013 | Hayakawa et al. |
| 8,559,209 B2 | 10/2013 | Siau |
| 8,565,003 B2 | 10/2013 | Siau |
| 8,638,584 B2 | 1/2014 | Chevallier et al. |
| 8,654,565 B2 | 2/2014 | Chevallier et al. |
| 8,664,633 B2 | 3/2014 | Park |
| 8,675,389 B2 | 3/2014 | Chevallier et al. |
| 8,854,881 B2 | 10/2014 | Chevallier et al. |
| 8,891,276 B2 | 11/2014 | Siau et al. |
| 8,937,292 B2 | 1/2015 | Bateman |
| 9,129,668 B2 | 9/2015 | Chevallier et al. |
| 9,159,408 B2 | 10/2015 | Chevallier et al. |
| 9,384,806 B2 | 7/2016 | Chevallier et al. |
| 9,564,199 B2 | 2/2017 | Luan et al. |
| 9,570,515 B2 | 2/2017 | Chevallier et al. |
| 9,806,130 B2 | 10/2017 | Chevallier et al. |
| 9,818,799 B2 | 11/2017 | Wu et al. |
| 9,870,809 B2 | 1/2018 | Chevallier et al. |
| 10,186,553 B2 | 1/2019 | Wu et al. |
| 10,210,917 B2 | 2/2019 | Chevallier et al. |
| 10,650,870 B2 | 5/2020 | Chevallier et al. |
| 2001/0055838 A1 | 12/2001 | Walker et al. |
| 2002/0061604 A1 | 5/2002 | Sitaram |
| 2002/0114112 A1 | 8/2002 | Nakashio |
| 2002/0168785 A1 | 11/2002 | Paz de Araujo |
| 2003/0003674 A1 | 1/2003 | Hsu et al. |
| 2003/0003675 A1 | 1/2003 | Hsu |
| 2003/0043633 A1 | 3/2003 | Forbes |
| 2003/0132456 A1 | 7/2003 | Miyai |
| 2003/0137869 A1 | 7/2003 | Kozicki |
| 2003/0148545 A1 | 8/2003 | Zhuang et al. |
| 2003/0151959 A1 | 8/2003 | Tringali |
| 2003/0156445 A1 | 8/2003 | Zhuang et al. |
| 2004/0004237 A1 | 1/2004 | Fox |
| 2004/0063274 A1 | 4/2004 | Hsu |
| 2004/0100817 A1 | 5/2004 | Subramanian |
| 2004/0109353 A1 | 6/2004 | Matsuoka |
| 2004/0114413 A1 | 6/2004 | Parkinson |
| 2004/0141369 A1 | 7/2004 | Noguchi |
| 2004/0159828 A1 | 8/2004 | Rinerson |
| 2004/0159867 A1 | 8/2004 | Kinney et al. |
| 2004/0159868 A1 | 8/2004 | Rinerson |
| 2004/0159869 A1 | 8/2004 | Rinerson et al. |
| 2004/0161888 A1 | 8/2004 | Rinerson |
| 2004/0170040 A1 | 9/2004 | Rinerson et al. |
| 2004/0180507 A1 | 9/2004 | Zhang et al. |
| 2005/0018516 A1 | 1/2005 | Chevallier et al. |
| 2005/0040482 A1 | 2/2005 | Suzuki |
| 2005/0083760 A1 | 4/2005 | Subramanian |
| 2005/0111263 A1 | 5/2005 | Rinerson |
| 2005/0135148 A1 | 6/2005 | Chevallier |
| 2005/0151156 A1 | 7/2005 | Wu |
| 2005/0174835 A1 | 8/2005 | Rinerson et al. |
| 2005/0200785 A1 | 9/2005 | Jones |
| 2005/0243595 A1 | 11/2005 | Rinerson et al. |
| 2005/0269626 A1 | 12/2005 | Forbes |
| 2006/0018149 A1 | 1/2006 | Rinerson et al. |
| 2006/0023497 A1 | 2/2006 | Kawazoe |
| 2006/0050598 A1 | 3/2006 | Rinerson et al. |
| 2006/0054937 A1 | 3/2006 | Lucovsky et al. |
| 2006/0125102 A1 | 6/2006 | Wu |
| 2006/0131695 A1 | 6/2006 | Kuekes et al. |
| 2006/0171200 A1 | 8/2006 | Rinerson et al. |
| 2006/0245241 A1 | 11/2006 | Rinerson et al. |
| 2006/0245243 A1 | 11/2006 | Rinerson et al. |
| 2006/0252733 A1 | 11/2006 | Jansen |
| 2006/0273301 A1 | 12/2006 | Moddel |
| 2007/0018219 A1 | 1/2007 | Lim |
| 2007/0027093 A1 | 2/2007 | Ogawa et al. |
| 2007/0032404 A1 | 2/2007 | Sweet et al. |
| 2007/0105390 A1 | 5/2007 | Oh |
| 2007/0120110 A1 | 5/2007 | Estes |
| 2007/0132049 A1 | 6/2007 | Stipe |
| 2007/0155145 A1 | 7/2007 | Hong |
| 2007/0166989 A1 | 7/2007 | Fresco |
| 2007/0223282 A1 | 9/2007 | Sarig |
| 2007/0252201 A1 | 11/2007 | Kito |
| 2007/0253245 A1 | 11/2007 | Ranjan et al. |
| 2007/0269683 A1 | 11/2007 | Chen |
| 2008/0005459 A1 | 1/2008 | Norman |
| 2008/0014750 A1 | 1/2008 | Nagashima |
| 2008/0054317 A1 | 3/2008 | Kim |
| 2008/0068875 A1 | 3/2008 | Choi |
| 2008/0079029 A1 | 4/2008 | Williams |
| 2008/0084727 A1 | 4/2008 | Norman |
| 2008/0090337 A1 | 4/2008 | Williams |
| 2008/0090401 A1 | 4/2008 | Bratkovski et al. |
| 2008/0109775 A1 | 5/2008 | Norman |
| 2008/0157127 A1 | 7/2008 | Bertin et al. |
| 2008/0173975 A1 | 7/2008 | Chen |
| 2008/0175032 A1 | 7/2008 | Tanaka |
| 2008/0217600 A1 | 9/2008 | Gidon |
| 2008/0237800 A1 | 10/2008 | Chinthakindi |
| 2008/0247219 A1 | 10/2008 | Choi |
| 2008/0265235 A1 | 10/2008 | Kamigaichi |
| 2008/0272363 A1 | 11/2008 | Mouli |
| 2008/0273363 A1 | 11/2008 | Mouli |
| 2008/0278989 A1 | 11/2008 | Lee et al. |
| 2008/0293196 A1 | 11/2008 | Rinerson et al. |
| 2009/0016094 A1 | 1/2009 | Rinerson |
| 2009/0020744 A1 | 1/2009 | Mizukami |
| 2009/0026434 A1 | 1/2009 | Malhotra |
| 2009/0026441 A1 | 1/2009 | Cheung |
| 2009/0026442 A1 | 1/2009 | Cheung |
| 2009/0027976 A1 | 1/2009 | Rinerson et al. |
| 2009/0045390 A1 | 2/2009 | Rinerson et al. |
| 2009/0101885 A1 | 4/2009 | Seko |
| 2009/0122598 A1 | 5/2009 | Toda |
| 2009/0146325 A1 | 6/2009 | Liu |
| 2009/0154232 A1 | 6/2009 | Norman |
| 2009/0164203 A1 | 6/2009 | Norman |
| 2009/0164744 A1 | 6/2009 | Norman |
| 2009/0172350 A1 | 7/2009 | Norman |
| 2009/0179184 A1 | 7/2009 | Liu |
| 2009/0196083 A1 | 8/2009 | Norman |
| 2009/0198485 A1 | 8/2009 | Norman |
| 2009/0213633 A1 | 8/2009 | Rinerson |
| 2009/0225582 A1 | 9/2009 | Schloss |
| 2009/0261314 A1 | 10/2009 | Kim |
| 2009/0302315 A1 | 12/2009 | Lee et al. |
| 2009/0303772 A1 | 12/2009 | Rinerson |
| 2009/0303773 A1 | 12/2009 | Rinerson |
| 2009/0316465 A1 | 12/2009 | Jain |
| 2010/0044666 A1 | 2/2010 | Baek et al. |
| 2010/0051896 A1 | 3/2010 | Park |
| 2010/0067279 A1 | 3/2010 | Choi |
| 2010/0073990 A1 | 3/2010 | Siau et al. |
| 2010/0078759 A1 | 4/2010 | Sekar et al. |
| 2010/0103724 A1 | 4/2010 | Kim |
| 2010/0108975 A1 | 5/2010 | Sun |
| 2010/0110758 A1 | 5/2010 | Li |
| 2010/0110771 A1 | 5/2010 | Choi |
| 2010/0115220 A1 | 5/2010 | Lee et al. |
| 2010/0118589 A1 | 5/2010 | Carter |
| 2010/0134239 A1 | 6/2010 | Wu et al. |
| 2010/0155686 A1 | 6/2010 | Bratkovski et al. |
| 2010/0155687 A1 | 6/2010 | Reyes |
| 2010/0155722 A1 | 6/2010 | Meyer |
| 2010/0155723 A1 | 6/2010 | Bornstein et al. |
| 2010/0155953 A1 | 6/2010 | Bornstein |
| 2010/0157647 A1 | 6/2010 | Rinerson et al. |
| 2010/0157657 A1 | 6/2010 | Rinerson et al. |
| 2010/0157658 A1 | 6/2010 | Schloss et al. |
| 2010/0157670 A1 | 6/2010 | Chevallier et al. |
| 2010/0157710 A1 | 6/2010 | Lambertson |
| 2010/0159641 A1 | 6/2010 | Rinerson et al. |
| 2010/0159688 A1 | 6/2010 | Rinerson et al. |
| 2010/0161888 A1 | 6/2010 | Eggleston |
| 2010/0161918 A1 | 6/2010 | Norman |
| 2010/0187660 A1 | 7/2010 | Tang |

(56) References Cited

U.S. PATENT DOCUMENTS

| | | |
|---|---|---|
| 2010/0195393 A1 | 8/2010 | Eggleston |
| 2010/0202188 A1 | 8/2010 | Rinerson et al. |
| 2010/0219392 A1 | 9/2010 | Awaya |
| 2010/0232200 A1 | 9/2010 | Shepard |
| 2010/0232240 A1 | 9/2010 | Norman |
| 2010/0259960 A1 | 10/2010 | Samachisa |
| 2010/0271885 A1 | 10/2010 | Scheuerlein et al. |
| 2010/0278479 A1 | 11/2010 | Bratkovski et al. |
| 2010/0290294 A1 | 11/2010 | Siau |
| 2010/0323490 A1 | 12/2010 | Sreenivasan |
| 2011/0006275 A1 | 1/2011 | Roelofs et al. |
| 2011/0017977 A1 | 1/2011 | Bratkovski et al. |
| 2011/0024710 A1 | 2/2011 | Bratkovski et al. |
| 2011/0024716 A1 | 2/2011 | Bratkovski et al. |
| 2011/0059576 A1 | 3/2011 | Cho et al. |
| 2011/0063914 A1 | 3/2011 | Mikajiri |
| 2011/0149634 A1 | 6/2011 | Schloss et al. |
| 2011/0149636 A1 | 6/2011 | Schloss et al. |
| 2011/0155990 A1 | 6/2011 | Cheung |
| 2011/0182103 A1 | 7/2011 | Smythe et al. |
| 2011/0186803 A1 | 8/2011 | Rinerson et al. |
| 2011/0188281 A1 | 8/2011 | Chevallier et al. |
| 2011/0188282 A1 | 8/2011 | Chevallier et al. |
| 2011/0188283 A1 | 8/2011 | Chevallier et al. |
| 2011/0188284 A1 | 8/2011 | Chevallier et al. |
| 2011/0188289 A1 | 8/2011 | Chevallier et al. |
| 2011/0204019 A1 | 8/2011 | Bornstein |
| 2011/0220860 A1 | 9/2011 | Kim |
| 2011/0266538 A1 | 11/2011 | Lee |
| 2011/0297927 A1 | 12/2011 | Ramaswamy et al. |
| 2012/0012897 A1 | 1/2012 | Besser et al. |
| 2012/0033481 A1 | 2/2012 | Rinerson et al. |
| 2012/0064691 A1 | 3/2012 | Rinerson et al. |
| 2012/0087174 A1 | 4/2012 | Rinerson |
| 2012/0091413 A1 | 4/2012 | Nguyen |
| 2012/0147678 A1 | 6/2012 | Norman |
| 2012/0211716 A1 | 8/2012 | Meyer |
| 2012/0314468 A1 | 12/2012 | Siau |
| 2013/0043452 A1 | 2/2013 | Meyer |
| 2013/0043455 A1 | 2/2013 | Bateman |
| 2013/0082228 A1 | 4/2013 | Parrillo et al. |
| 2013/0082232 A1 | 4/2013 | Wu |
| 2014/0140122 A1 | 5/2014 | Siau |

FOREIGN PATENT DOCUMENTS

| | | |
|---|---|---|
| JP | 2003-092387 A | 3/2003 |
| JP | 2004-193595 A | 7/2004 |
| JP | 2005-203733 A | 7/2005 |
| WO | 00/48196 A1 | 8/2000 |
| WO | 33/079463 A2 | 9/2003 |
| WO | 2005/117021 A1 | 5/2004 |
| WO | 2006/029228 A2 | 3/2006 |
| WO | 07/047880 A1 | 4/2007 |

OTHER PUBLICATIONS

Casperson Brewer, Julie D., et al., "Determination of Energy Barrier Profiles for High-k Dielectric Materials Utilizing Bias-Dependent Internal Photoemission", Applied Physics Letters, vol. 85, No. 18, Nov. 1, 2004, pp. 11334135.

Casperson, J. D., "Design and Characterization of Layered Tunnel Barriers for Nonvolatile Memory Applications", PhD Thesis, Caltech, May 17, 2004, pp. 1-143.

Casperson, Julie D , et al., "Materials Issues for Layered Tunnel Barrier Structures", Journal of Applied Physics, vol. 92, No. 1, Jul. 1, 2002, pp. 261-267.

HP Datasheet, "HP Pavilion dv7-7012nr Entertainment PC," Product No. B2P31 UA#ABA, Ad Embargo date of Apr. 29, 2012, 2 pages.

Korotkov, Alexander, et al., "Resonant Fowler-Nordheim Tunneling Through Layered Tunnel Barriers and its Possible Applications", Techn. Dig IDEM 1999, pp. 223-226.

Kurjanowicz, Wlodek, "Evaluating Embedded Non-Volatile Memory for 65nm and Beyond", DesignCon 2008, Feb. 4, 2008, 23 pages.

Kwok, K. Ng, "Complete Guide to Semiconductor Devices", 1995, McGraw-Hill Inc., pp. 11-40; pp. 56-62 pp. 84-91; pp. 337-349.

Likharev, Konstantin K., "Layered Tunnel Barriers for Nonvolatile Memory Devices", Applied Physics Letters, vol. 73, No. 15, Oct. 12, 1998, pp. 2137-2139.

Luryi, S., et al., "Optimum Baritt Structure", Solid-State Electronics, vol. 25, No. 9, Sep. 1982, pp. 943-945.

Mikolajick, T., et al., "Scaling of Nonvolatile Memories to Nanoscale Feature Sizes", Materials Science-Poland, vol. 25, No. 1, 2007, pp. 33-43.

PCT International Preliminary Reporton Patentability dated Aug. 28, 2007 in PCT Application No. PCT/US2005/031913, 5 pages.

PCT International Search Report dated Feb. 14, 2006 in PCT Application No. PCT/US2005/031913, 4 pages.

PCT Written Opinion of the International Search Authority dated Sep. 3, 2004 in PCT Application No. PCT/2005/031913, 7 pages.

Peacock, P. W., et al., "Band Offsets and Schottky Barrier Heights of High Dielectric Constant Oxides", Journal of Applied Physics, vol. 92, No. 8, Oct. 15, 2002, pp. 4712-4721.

Poltavets, Viktor V., "Outline of Research (a few examples)", <http://www.poltavets.com/>, printed on Nov. 20, 2007, 4 pages.

Subias, Gloria, et al., "Mn Local Structure Effects in Charge-Ordered Mixed-Valence RE1-xCaxMnO3 (RE: La, Tb) Perovskites: A Review of the Experimental Situation", 2002 J. Phys.: Condens. Matter, vol. 14, pp. 5017-5033, abstract only.

Tans, Sander J., et al., "Room-Temperature Transistor Based on a Single Carbon Nanotube", Nature, vol. 393, May 7, 1998, pp. 49-52.

Yamauchi Hisao et al., "Control of Mixed Valence Stae to Yield Novel Functions in Double-Perovskite Iron-Copper Oxides", Science Links Japan, Nippon Sheet Glass Foundation for Materials Science and Engineering Report, vol. 21, 2003, pp. 113-122, abstract only.

Beck, A. et al., "Reproducible switching effect in thin oxide films for memory applications," Applied Physics Letters, vol. 77, No. 1, Jul. 3, 2000,139-141.

Liu, S.Q., et al., "Electric-pulse-induced reversible resistance change effect in magnetoresistivefilms", Applied Physics Letters, vol. 76, No. 19, May 8, 2000, 2749-2651.

Liu, S.Q., et al., "A New Concept For Non-Volatile Memory: Electric-Pulse Induced Reversible Resistance Change Effect In Magnetoresistive Films", Non-Volatile Memory Technology Symposium, Nov. 7, 2001, Space Vacuum Epitaxy Center, University of Houston, Houston TX, pp. 1-7.

Rossel, C. et al., "Electrical current distribution across a metal-insulator-metal structure during bistable switching," Journal of Applied Physics, vol. 90, No. 6, Sep. 15, 2001, 2892-2898.

Natanabe, Y. et al., "Current-driven insulator-conductor transition and nonvolatile memory in chromium-doped SrTiO3 single crystals," Applied Physics Letters, vol. 78, No. 23, Jun. 4, 2001, 3738-3740.

Zhuang, W.W. et al., "Novel colossal magnetoresislive thin film nonvolatile resistance random access memory (RRAM)"; IEDM Technical Digest, IEEE, Dec. 8, 2002, pp. 193-196.

A.Baikalov, et al., "Field-driven hysteretic and reversible resistive switch at the Ag-Pr0.7Ca0.3MnO3 interface" Applied Physics Letters, vol. 83, No. 5, Aug. 4, 2003, pp. 957-959.

A. Sawa, et al., "Hysteretic current-volyage characteristics and resisitance switching at a rectifying Ti/Pro.7Cao.3MnO3 interface" Applied Physics Letters, vol. 85, No. 18, Nov. 1, 2004, pp. 4073-4075.

David Oxley, "Memory Effects in Oxide Films" in Oxides and Oxide Films, vol. 6, pp. 251-325 (Chapter 4) (Ashok. K. Vijh ed., Marcel Drekker) (1981).

J.G. Simmons and R.R. Verderber, New Conduction and Reversible Memory Phenomena in Thin Insulating Films/ Proc. Roy. Soc. A., 301 (1967), pp. 77-102.

R.E. Thurstans and D.P. Oxley, "The Electroformed metal-insulator-metal structure: A comprehensive model," J. Phys. D.: Appl. Phys 35 (2002), Apr. 2, 2002, pp. 802-809.

(56) References Cited

OTHER PUBLICATIONS

R. Oligschlaeger, R. Waser, R. Meyer, S. Karthiiuser, R. Dillmann, "Resistive switching and data reliability of epitaxial (Ba,Sr)TiO thin films," Applied Physics Letters, 88 (2006), 042901.

S. Lai, T. Lowrey, "OUM—A 180 nm nonvolatile memory cell element technology for standalone and embedded applications," IEEE International Electron Device Meeting, Technical Digest, 803 (2001).

J. Mizusaki J, Y. Yonemura, H. Kamata, K. Ohyama, N. Mori, H. Takai, H. Tagawa M. Dokiya, K. Naraya, T. Sasamoto, H. Inaba, T. Hashimoto, "Electronic conductivity, Seebeck coefficient, defect and electronic structure of nonstoichiometric La1.xSr1MnO3," Solid State Ionics 132, 167 (2000).

Zhao Y. G.; Rajeswari M.; Srivastava R. C.; Biswas A.; Ogale S. B.; Kang D. J.; Prellier W.; Zhiyun Chen ; Greene R. L.; Venkatesan T., "Effect of oxygen content on the structural, transport, and magnetic properties of La1-deltaMn1-deltaO3 thin films," Journal of Applied Physics, vol. 86, No. 11, Dec. 1999, pp. 6327-6330.

B.C.H. Steele, A. Heinzel, "Materials for Fuel-Cell-Technologies," Nature 414, Nov. 2001, pp. 345-352.

A. RelJer, J.M. Thomas, D. A. Jefferson, M. K. Uppal, "Superstructures Formed by the Ordering of Vacancies in a Selective Oxidation Catalyst: Grossly Defective CaMnO3," Proceedings of the Royal Society of London, vol. 394, No. 1807, Aug. 1984, pp. 223-241.

A. J. Millis, "Cooperative Jahn-Teller effect and electron-phonon coupling in La1-xAxMnO3," Phys. Rev. B 53, 8434-8441 (1996).

Catapano, Ezetimibe: a selective inhibitor of cholesterol absorption, European Heart Journal Supplements 2001 (3, Supplemental E): E6-E10).

Knopp RH, Drug treatment of lipid disorders. New England J. Med. 1999; 341 (7): 498-511; electronic pp. 1-25.

Li, et al., "Discovery of Potent and Orally Active MTP Inhibitors as Potential Anti-Obesity Agents," Bioorganic & Medicinal Chemistry Letters, Oxford, GB, vol. 16, No. 11, Jun. 1, 2006, pp. 3039-3042.

Looije, Norbert A., et al., "Disodium Ascorbyl Phytostanyl Phosphates (FM-VP4) Reduces Plasma Cholesterol Concentration, Body Weight and Abdominal Fat Gain Within a Dietary-Induced Obese Mouse Model," Journal of Pharmacy & Pharmaceutical Sciences: A Publication of the Canadian Society for Pharmaceutical Sciences, vol. 8, No. 3, 2005, pp. 400-408.

Crowley et al., "16.4: 512Mb PROM with 8 Layers of Antifuse/Diode Cells," 2003 IEEE ISSCC, First Edition, pp. 284-285, 493, Feb. 11, 2003.

EP Office Action dated Aug. 2, 2007 in EP 05794930. 7. 4 pages.

Lai et al., "OUM—A 180 nm Nanvolatile Memory Cell Element Technology For Stand Alone and Embedded Applications," IEEE International Electron Device Meeting, Technical Digest, vol. 803, 2001.

Lee et al., "Near Edge X-ray Absorption Fine Structure Study of Pr0.65Ca0.35MnO3 Films," Phys. Stat, sol (a) 196, No. 1, 2003, pp. 70-73.

Millis, A.J., "Cooperative Jahn-Teller Effect and Electron-Phonon Coupling in La-1-xAx.Mn03", Phys. Rev. B 53 8434-8441 (1996). 8 pages.

Nian, Y.B., et al.," Evidence for an Oxygen Diffusion Model for the Electric Pulse Induced Resistance Change Effect in Oxides", Texas Center for Advanced Materials, University of Houston (2006). 7 pages.

Reller et al., "Superstructres Formed by the Ordering of Vacancies in a Selective Oxidation Catalyst: Grossly Defective CaMn03," Proceedings of the Royal Society of London, vol. 394, No. 1807, Aug. 1984, pp. 223-241.

Reller, A. et al.,"Superstructures Formed by the Ordering of Vacancies in a Selective Oxidation Catalyst: Grossly Defective CaMn03", Printed in Great Britain, Department of Physical Chemistry, University of Cambridge, Lensfield Road, Cambridge, CB2 1EP, U.K., vol. 194. Aug. 8, 1984. 1 page.

Stetter. J.R., et al., "Sensors, Chemical Sensors, Electrochemical Sensors, and ECS", Journal of Electrochemical Society, 150 (2), S11-S16 (2003).

Zhao, Y.G., et al., "Effect of Oxygen Content on the Structural, Transport, and Magnetic Properties of La 1-deltaMn 1-delta03 thin films," Journal of Applied Physics, vol. 86, No. 11, Dec. 1999, pp. 6327-6330.

Zhuang, W.W. et al., "Novell Colossal Magnetoresistive Thin Film Nonvolatile Resistance Random Access Memory RRAM)", IEDM Technical Digest, IEEE, Dec. 8, 2002, pp. 193-196.

Chemical Elements.com, "Periodic Table: Transition Metals", 1996, downloaded0 Mar. 19, 2017 from http://www.chemicalelements.com/groups/transition.html. 2 pages.

Abelmann et al., "Self-Assembled Three-Dimensional Non-Volatile Memories", Micromachines, vol. 1, pp. 1-18, Jan. 18, 2010.

Baek et al., "Realization of Vertical Resistive Memory (VRRAM) Using Cost Effective 3D Process", IDEM 2011, 31, 8.1, pp. 737-740.

Chevallier et al., "A 0.13um 64Mb Multi-layered Conductive Metal-Oxide Memory", ISSC 2010/Session 14/Non-Volatile Memory/14.3, pp. 260-261.

Dong et al., "Si/a-Si Core/Shell Nanowires as Nonvolatile Crossbar Switches", Nano Letters 2008, vol. 8, No. 29, pp. 361-391.

Jang et al., "Vertical Cell Array Using TCAT (Terabit Cell Array Transistor) Technology for Ultra High Density 11 NAND Flash Memory", 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices", 2009 Symposium on VLSI Technology Digest of Technical Papers, pp. 136-137.

Kim et al., "Novel Vertical-Stacked-Array-Transistor (VSAT) for Ultra-High-Density and Cost-Effective NANO Flash Memory Devices and SSD (Solid State Drive)," 2009 Symposium on VLSI Technology Digest of Technical Papers, pp. 186-187.

Kim et al., "Multi-Layered Vertical Gate NANO Flash Overcoming Stacking Limit for Terabit Density Storage", 2009 VLSI Symposium on VLSI Technology Digest of Technical Papers, Jun. 16-18, 2009, pp. 188-189.

Krieger, Ju H., "Principle Operation of 3-D Memory Device based on Piezoacousto Properties of Ferroelectric Films", In Tech, Dec. 2010, pp. 3-16.

Kwong et al., "Vertical Silicon Nanowire Platform for Low Power Electronics and Clean Energy Applications", May 25, 2011, Journal of Nanotechnology, vol. 2012, Article ID 492121, 21 pages.

Lue et al., "A Highly Scalable 8-Layer 30 Vertical-Gate (VG) TFT NANO Flash Using Junction-Free Buried Channel BE-SONOS Device", 2010 Symposium on VLSI Technology, Jun. 15-17, 2010, pp. 131-132.

Ou et al., "Array Architecture for a Nonvolatile 3-Dimensional Cross-Point Memory", Doctoral Dissertation, Stanford University, Mar. 2010, pp. 1-119.

Ou et al., "Array Architecture for a Nonvolatile 3-Dimensional Cross-Point Resistance-Change Memory", IEEE Journal of Solid-State Circuits, vol. 46, No. 9, Sep. 2011.

Strachan et al., "The switching location of a bipolar memristor: chemical, thermal and structural mapping", Nanotechnology 22 (2011) 254015, pp. 1-6.

Yoon et al., Vertical Cross-point Resistance Change Memory for Ultra-High Density Non-volatile Memory Applications, 2009 Symposium on VLSI Technology Digest of Technical Papers, pp. 26-27.

Zhang et al., "A 3D RRAM Using Stackable 1TXR Memory Cell for High Density Application", IEEE Xplore, Feb. 5, 2010, pp. 917-920.

Extended European Search Report dated May 25, 2011, issued in related European Application No. 10182254.2 (5 pages).

First Office Action dated Jan. 6, 2014, issued in related Chinese Application No. 201210193421.1, with English machine translation (7 pages).

Notice of Reasons for Refusal dated Feb. 7, 2012, issued in related Japanese Application No. 2007-530487, with English machine translation (6 pages).

Final Notification of Reasons for Refusal dated Jan. 8, 2013, issued in related Japanese Application No. 2007-530487, with English machine translation (6 pages).

(56) References Cited

OTHER PUBLICATIONS

PCT International Search Report dated May 23, 2006, issued in related International Application No. PCT/US2005/031913 (3 pages).
PCT Written Opinion dated May 24, 2006, issued in related International Application No. PCT/US2005/031913 (7 pages).
PCT International Preliminary Report on Patentability dated Aug. 28, 2007, issued in related International Application No. PCT/US2005/031913 (5 pages).
Non-Final Office Action dated Mar. 7, 2018, issued in related U.S. Appl. No. 15/811,179 (8 pages).
Non-Final Office Action dated Apr. 5, 2017, issued in related U.S. Appl. No. 15/338,857 (9 pages).
Non-Final Office Action dated Sep. 14, 2015, issued in related U.S. Appl. No. 14/453,982 (8 pages).
Notice of Allowance dated Jul. 5, 2016, issued in related U.S. Appl. No. 14/453,982 (10 pages).

MULTI-LAYERED CONDUCTIVE METAL OXIDE STRUCTURES AND METHODS FOR FACILITATING ENHANCED PERFORMANCE CHARACTERISTICS OF TWO-TERMINAL MEMORY CELLS

CROSS REFERENCE TO RELATED APPLICATIONS

This application is a continuation of and claims priority benefit to U.S. patent application Ser. No. 16/705,077, filed Dec. 5, 2019, which is a continuation and claims priority benefit to U.S. patent application Ser. No. 16/219,219, filed Dec. 13, 2018, which is a continuation and claims priority benefit to U.S. patent application Ser. No. 15/811,179, filed Nov. 13, 2017, now U.S. Pat. No. 10,186,553, which is a continuation of and claims priority benefit to U.S. patent application Ser. No. 15/338,857, filed Oct. 31, 2016, now U.S. Pat. No. 9,818,799, which is a continuation of and claims priority benefit to U.S. patent application Ser. No. 14/453,982, filed Aug. 7, 2014, now U.S. Pat. No. 9,484,533, which is a continuation of and claims priority benefit to U.S. patent application Ser. No. 13/250,923, filed Sep. 30, 2011. This application is related to U.S. patent application Ser. No. 11/095,026, filed Mar. 30, 2005, published as U.S. publication no. 2006/0171200, and entitled "Memory Using Mixed Valence Conductive Oxides;" U.S. patent application Ser. No. 12/653,836, filed Dec. 18, 2009, and published as U.S. publication no. 2010/0157658, and titled "Conductive Metal Oxide Structures In Non-Volatile Re-Writable Memory Devices;" U.S. Pat. No. 7,897,951, issued on Mar. 1, 2011, and titled "Continuous Plane Of Thin-Film Materials For A Two-Terminal Cross-Point Memory;" U.S. patent application Ser. No. 12/653,851, filed Dec. 18, 2009, and published as U.S. publication no. 2010/0159641, and titled "Memory Cell Formation Using Ion Implant Isolated Conductive Metal Oxide;" U.S. patent application Ser. No. 13/171,350, filed Jun. 28, 2011, and titled "Multilayer Cross-Point Memory Array Having Reduced Disturb Susceptibility;" U.S. patent application Ser. No. 13/210,342, filed Aug. 15, 2011, and titled "Structures And Methods For Facilitating Enhanced Cycling Endurance Of Memory Accesses To Re-Writable Non-Volatile Two-Terminal Memory Elements;" U.S. Pat. No. 7,995,371, issued on Aug. 9, 2011, and titled "Threshold Device For A Memory Array;" U.S. Pat. No. 7,884,349, issued on Feb. 8, 2011, and titled "Selection Device for Re-Writable Memory;" U.S. patent application Ser. No. 12/454,322, filed May 15, 2009, and titled "Device Fabrication;" U.S. patent application Ser. No. 13/250,772, filed Sep. 30, 2011, and titled "Memory Device Using Multiple Tunnel Oxide Layers;" and U.S. patent application Ser. No. 13/210,292, filed Aug. 15, 2011, and titled "Vertical Cross-Point Arrays For Ultra-High-Density Memory Applications." All of the above-referenced applications, application publications, and issued patents are hereby incorporated by reference in their entirety for all purposes.

TECHNICAL FIELD

Embodiments of the invention relate generally to semiconductors and memory technology, and more particularly, to systems, integrated circuits, and methods to enhance cycling endurance, as well as the memory effect, of memory elements, such as implemented in third dimensional memory technology.

BACKGROUND OF THE INVENTION

Conventional memory architectures and technologies, such as those including dynamic random access memory ("DRAM") cells and Flash memory cells, typically are not well-suited to resolve issues of manufacturing and operating resistance change-based memory cells. The above-described memory architectures, while functional for their specific technologies, fall short of being able to adequately address the issues of cycling endurance of resistance-based memory elements and the degradation due to repeated program-erase cycles. As the structures of conventional memory cells differ from resistance-based memory elements, there are different requirements and approaches to improve the reliability (e.g., cycling endurance) of two-terminal resistance-based memory elements.

In certain conventional approaches to forming resistance-based memory elements, materials providing mobile ions have been formed on multiple layers to form a reservoir of ions used in transport to another material for modifying the resistance of the memory cell. Typically, the multiple layers are formed with identical materials and compositions and cooperate to operate as an ionic conductor and an electronic insulator. While functional, there are certain performance deficiencies associated with this structure.

FIG. 1 depicts sub-optimal performance characteristics associated with a conventional multi-layered structure material operable as an ionic conductor and an electronic insulator. Diagram 100 depicts various magnitudes of current I through a memory cell over a number of program-erase cycles, the memory cell being formed with a material operable as an ionic conductor and an electronic insulator. As shown, the magnitudes of current I alternate between a first magnitude 110 associated with an erasing operation and a second magnitude 112 associated with a programming operation. Over a number of cycles 120, the conventional multi-layered structure has its performance characteristics degrade or other otherwise change. In this case, the current "drifts" lower in magnitudes over number of cycles 120 such that an average current magnitude 102 between magnitudes 110 and 112 decreases over a number of program-erase cycles. Typically, additional circuitry (e.g., sense amp circuitry) and resources are required to accommodate or filter out the current drift, especially when sensing a current representative of a data value, such as a read current generated by application of a read voltage during a read operation to a memory cell, for example. Further, the differences in magnitudes between first magnitudes 110 and second magnitudes 112 decrease during a number of cycles 122, which are subsequent in time to the number of cycles 120. In some cases, the phenomena depicted during number of cycles 120 can arise after, for example 10,000 program-erase cycles.

It would be desirable to provide improved systems, integrated circuits, and methods that minimize one or more of the drawbacks associated with conventional techniques for facilitating improved cycling endurance and memory effects for two-terminal resistance-based memory elements disposed in, for example, cross-point arrays or other memory structures suitable for two-terminal resistance-based memory elements.

BRIEF DESCRIPTION OF THE DRAWINGS

The invention and its various embodiments are more fully appreciated in connection with the following detailed description taken in conjunction with the accompanying drawings, in which.

Figure 1:
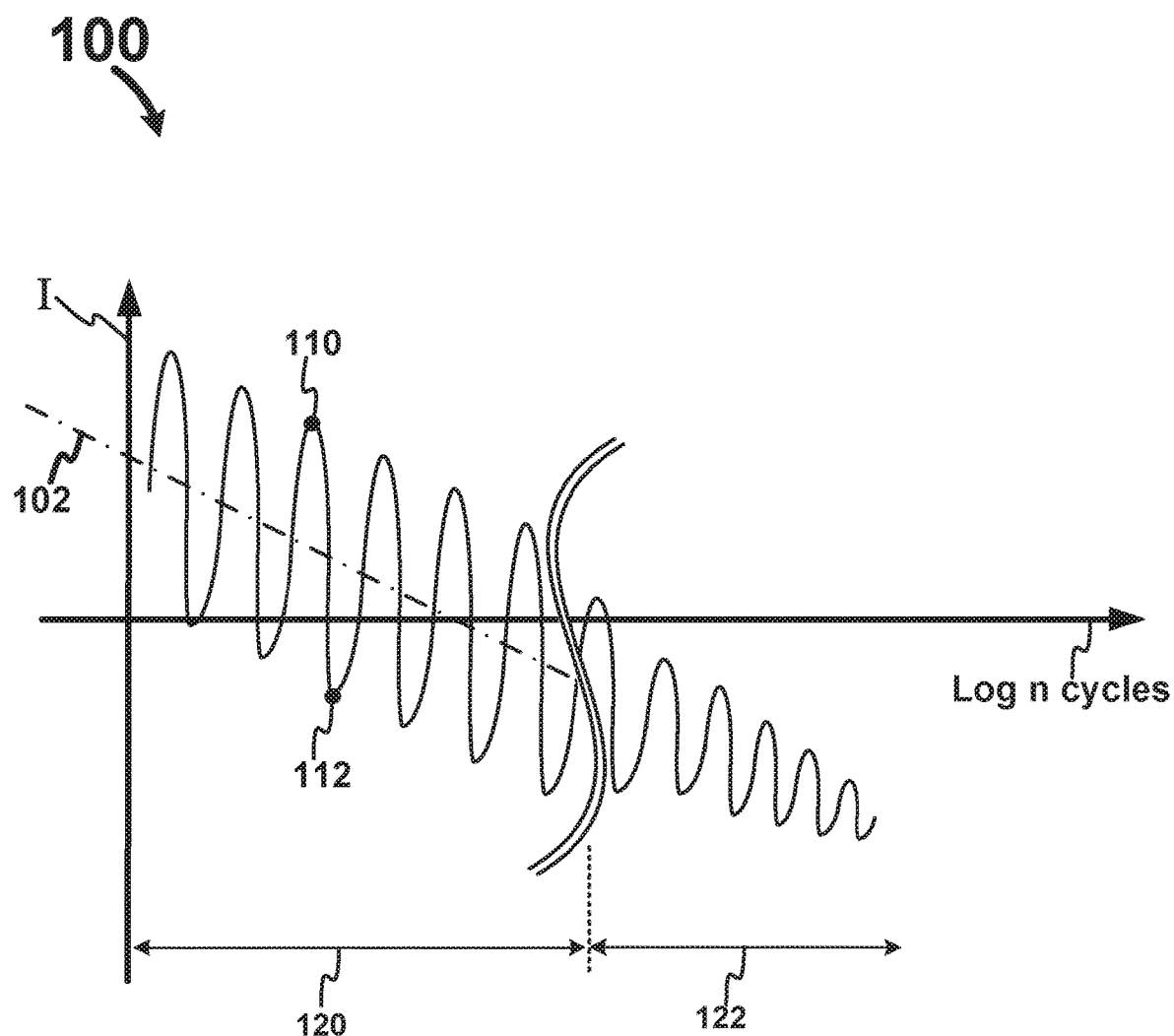
FIG. 1 depicts sub-optimal performance characteristics associated with a conventional multi-layered structure material operable as an ionic conductor and an electronic insulator.

Although the above-described drawings depict various examples of the invention, the invention is not limited by the depicted examples. It is to be understood that, in the drawings, like reference numerals designate like structural elements. Also, it is understood that the drawings are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, techniques such as those described herein enable emulation of multiple memory types for implementation on a single component such as a wafer, substrate, or die. U.S. patent application Ser. No. 11/095,026, filed Mar. 30, 2005, published as U.S. publication no. 2006/0171200, and entitled "Memory Using Mixed Valence Conductive Oxides," already incorporated by reference herein, describes non-volatile third dimensional memory elements that may be arranged in a two-terminal, cross-point memory array. New memory structures are possible with the capability of this third dimensional memory array. The technology allows for the emulation of other memory technologies by duplicating the interface signals and protocols, while accessing the third dimensional memory array. The third dimensional memory array may emulate other types of memory (e.g., emulation of DRAM, SRAM, ROM, EEPROM, FLASH, NAND FLASH, and NOR FLASH), providing memory combinations within a single component.

Semiconductor memories and memory material may be fabricated using the described techniques to create a single-layer or multiple-layer three-terminal memory and a single-layer or multiple-layer two-terminal memory, such as a cross-point memory described in U.S. patent application Ser. No. 11/095,026 (incorporated above). Using materials including but not limited to silicon oxide ($SiO_2$), platinum (Pt), titanium nitride (TiN), yttria-stabilized zirconia (YSZ), tungsten (W), conductive metal oxide (CMO), perovskites (e.g., PCMO), and others, a memory may be formed with at least one layer of continuous and memory material (e.g., unetched) sandwiched between two or more electrodes. As part of the formation of a memory cell, for example, a discrete bottom electrode of a memory cell may be formed by etching one or more layers of material. The etched layers may be filled with material and planarized. Above the bottom electrode, one or more layers of memory material may be deposited but not etched (i.e., continuous, unetched layers of memory material). Above the unetched layer(s) of memory material (e.g., the uppermost layer of continuous and unetched memory material), additional layers of material, including a material for a top electrode, and optionally a selection device ("SD") such as a non-ohmic device ("NOD"), for example, may be deposited and etched to form an implantation mask that, when implanted using ion implantation techniques, creates an insulating layer of conductive metal oxide ("CMO") (e.g., praseodymium calcium manganese oxide—PCMO) in regions of the CMO that are not covered by the implantation mask. The implantation mask may or may not include the NOD, that is, the NOD may be formed after the layers that comprise the implantation mask. The continuous and unetched layer(s) of CMO may include perovskite-based structures and materials (e.g., PCMO) that, when exposed to argon (Ar), xenon (Xe), titanium (Ti), zirconium (Zr), aluminum (Al), silicon (Si), oxygen (02), silicon and oxygen, or other types of ion implantation techniques and materials, creates regions of material that are electrically insulating and may be referred to as insulating metal oxide ("IMO"). Depending on the type of CMO material selected, its thickness, and processing conditions, the IMO regions can have an amorphous structure that is electrically insulating or a crystalline structure that is electrically insulating. The described techniques enables the formation of memories with small feature sizes and matrices of top and bottom electrodes that are electrically insulated from one another with a greater degree of fabrication reliability and decreased defect or degradation rates. The described fabrication techniques may be varied and are not limited to the examples provided.

In some embodiments, an IMO structure, such as an electrolytic tunnel barrier, and one or more mixed valence conductive oxide structures (e.g., one or more layers of a conductive oxide material) need not operate in a silicon substrate, and, therefore, can be fabricated above circuitry being used for other purposes. That is, the active circuitry portion can be fabricated front-end-of-the-line ("FEOL") on a substrate (e.g., a Silicon (Si) wafer, Si die, or other semiconductor substrate) and one or more layers of two-terminal cross-point memory arrays that include the non-volatile memory elements can be fabricated back-end-of-the-line ("BEOL") directly on top of the substrate and electrically coupled with the active circuitry in the FEOL layer using an inter-level interconnect structure, at least a portion of which, is also fabricated FEOL. Manufacturing process for forming FEOL circuitry on a semiconductor wafer followed by subsequent BEOL vertically memory fabrication above the FEOL circuitry is described in U.S. patent application Ser. No. 12/454,322, filed May 15, 2009, and titled "Device Fabrication", already incorporated herein by reference. Further, a two-terminal memory element can be arranged as a cross-point such that one terminal is electrically coupled with an X-direction line (or an "X-line") and the other terminal is electrically coupled with a Y-direction line (or a "Y-line"). A third dimensional memory can include multiple memory elements vertically stacked upon one another, sometimes sharing X-direction and Y-direction lines in a layer of memory, and sometimes having isolated lines. When a first write voltage, VW1, is applied across the memory element (e.g., by applying ½ VW1 to the X-direction line and ½ −VW1 to the Y-direction line), the memory element can switch to a low resistive state. When a second write voltage, VW2, is applied across the memory element (e.g., by applying ½ VW2 to the X-direction line and ½ −VW2 to the Y-direction line), the memory element can switch to a high resistive state. Memory elements using electrolytic tunnel barriers and mixed valence conductive oxides can have VW1 opposite in polarity from VW2.

Figure 2:
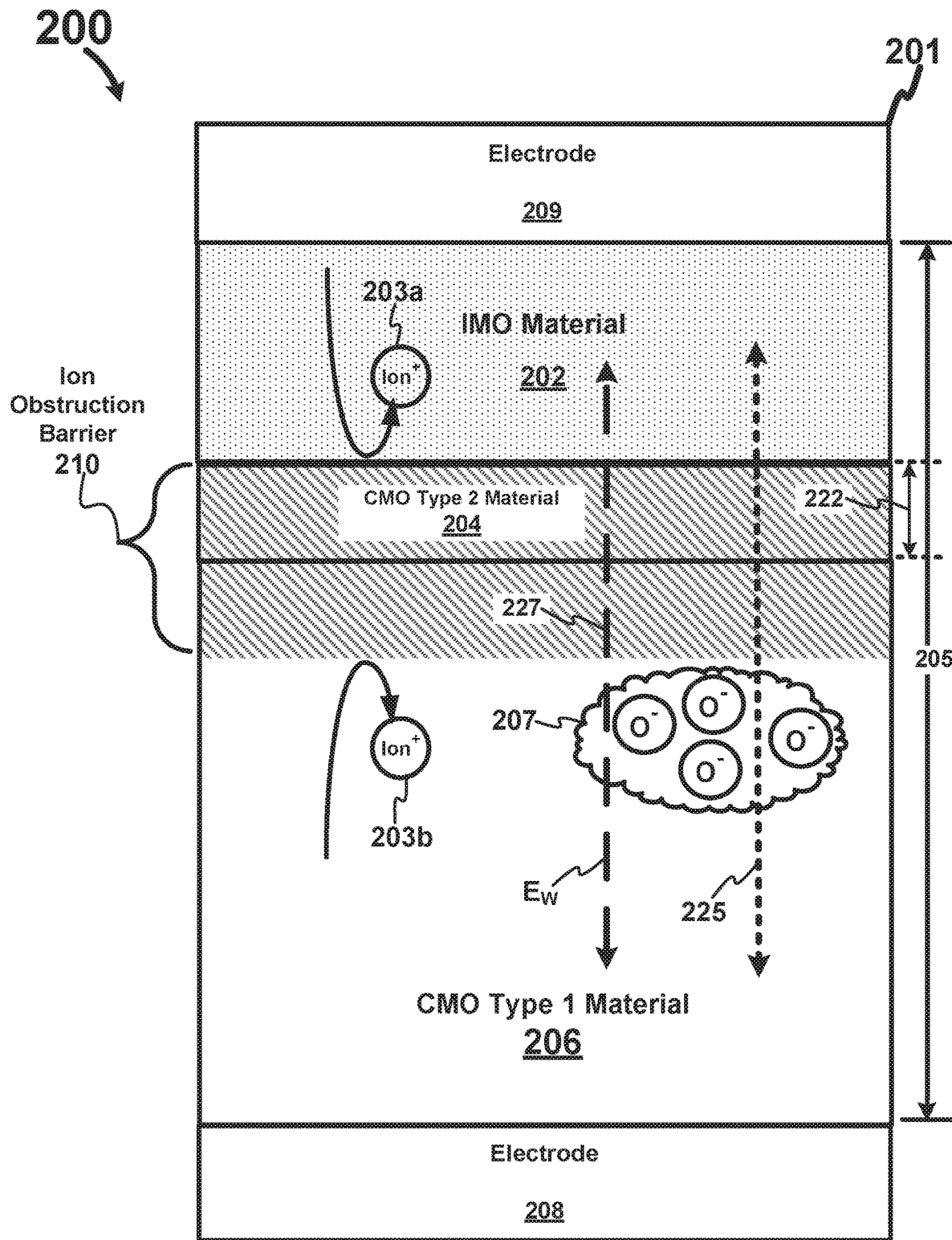
FIG. 2 depicts an example of a cross-sectional view of a portion of a memory cell including a memory element in accordance with various embodiments.

FIG. 2 illustrates a portion of a memory cell including a memory element in accordance with various embodiments. As shown, a portion 200 of a memory cell 201 includes an electrode 209 (e.g., a top electrode), a memory element 205, and an electrode 208 (e.g., a bottom electrode). Memory element 205 includes, but is not limited to, a layer of insulating metal oxide (IMO) 202 formed on multiple layers of conductive metal oxide (CMO), which is depicted as including a layer of CMO Type 2 Material 204 formed on a layer of CMO Type 1 material 206. In this example, the materials in layer of CMO Type 2 Material 204 and layer of CMO Type 1 material 206 have different compositions. Layers of CMO provide mobile oxygen ions 207 for ion transport 225 when various write voltage potentials are applied to electrodes 208 and 209 (e.g., from an external source) and those potentials generate an electric field $E_W$ 227 within the layers 202, 204, and 206 during write operations. Here, mobile oxygen ions (e.g., $O_2^-$) 207 will be denoted as $O^-$. Transport 225 of the mobile oxygen ions 207 is in a direction opposite that of the generated electric field $E_W$ 227. A magnitude and direction of the electric field $E_W$ 227 will depend on the magnitude and polarities of the write voltage potentials applied to electrodes 208 and 209.

Further, layer of CMO Type 2 Material 204 and a portion of layer of CMO Type 1 material 206 include an ion-implanted material. The ion-implanted material is disposed within the crystalline structures of the different compositions of layers 204 and 206 to form an ion obstruction barrier 210. Ion obstruction barrier 210 is configured to inhibit transport or diffusion of other mobile ions 203a and 203b (e.g., a cation or positively charged "+" ion) when a data operations voltage (e.g., a write voltage or a read voltage) is not being applied across electrodes 208 and 209, such that there is no electric field being generated that could cause transport of the other mobile ions 203a and 203b. Note, the other mobile ions 203a and 203b are not the mobile oxygen ions 207 and the mobile oxygen ions 207 are only transported 225 when a write voltage is applied across electrodes (208, 209) and electric field $E_W$ 227 is generated. Examples of other mobile ions 203a and 203b include metal ions and other like ions that can diffuse or otherwise transfer between IMO 202 and layers of CMO Type 2 204 and CMO Type 1 206. Note also, that mobile oxygen ions 207 are not transported 225 when a read voltage is applied across electrodes (208, 209). In some embodiments, memory element 205 constitutes a portion 201 of a two-terminal re-writeable non-volatile memory cell.

In view of the foregoing, the structures and/or functionalities of layers of CMO Type 2 204 and CMO Type 1 206 of different compositions can facilitate implementation of ion obstruction barrier 210 (and structures and/or functionalities thereof). In accordance with various embodiments, ion obstruction barrier 210 can provide for enhanced memory effect for re-writeable nonvolatile memory cells, enhanced cycling endurance over a number of write and erase cycles, and/or the stabilization of current magnitudes over the number of write and erase cycles. Examples of enhanced performance characteristics are depicted in FIGS. 3A and 3B.

Figure 3A:
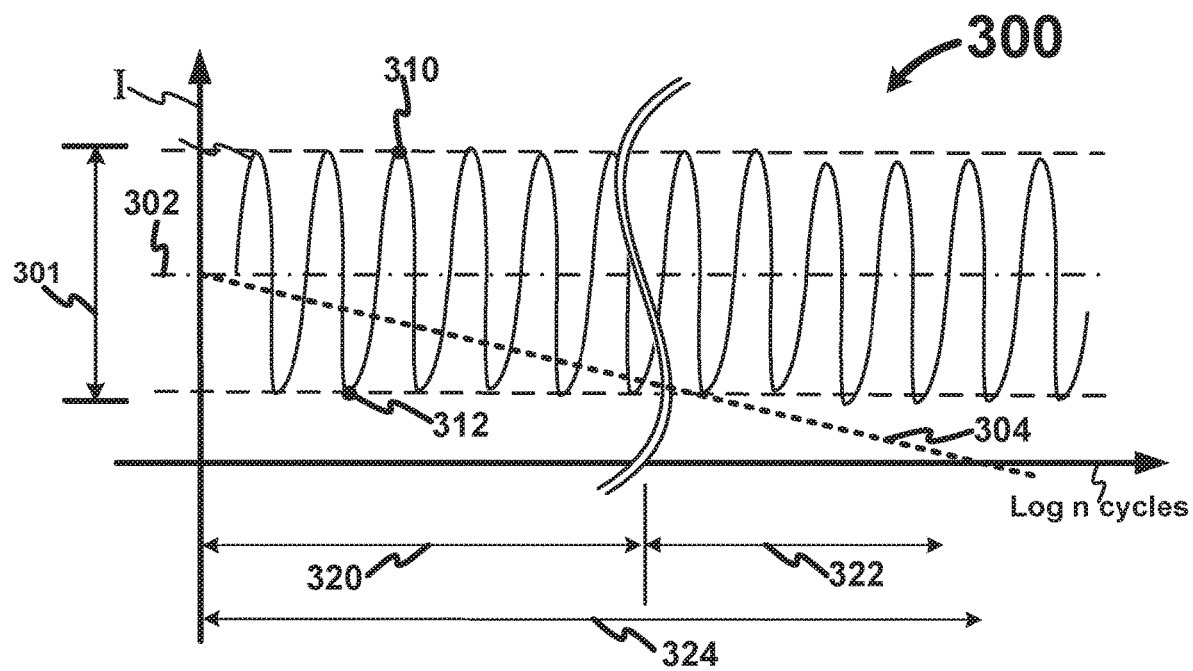
FIGS. 3A and 3B depict examples of enhanced performance characteristics for a memory cell such as the memory cell configuration depicted in FIG. 2, according to various embodiments.

FIG. 3A is a diagram 300 illustrating current magnitudes generated during program and erase cycles of a memory cell including portion 200 of a memory cell of FIG. 2, according to some embodiments. The current magnitudes range between a first magnitude 310 associated with an erase operation and a second magnitude 312 associated with a programming operation. Over a number of program-erase cycles 320, ion obstruction barrier 210 and/or the layers of CMO Type 2 204 and CMO Type 1 206 of different compositions facilitate stabilization of the current magnitudes, thereby reducing or eliminating current drift. In particular, ion obstruction barrier 210 provides for an average current magnitude 302 between magnitudes 310 and 312 that remains stable and is substantially the same over number of program-erase cycles 320. Stabilized current magnitudes obviate the necessity for additional circuitry (e.g., FEOL sense amp circuitry) and resources to accommodate current drift denoted by a current magnitude 304 that decreases over time as a function of the number of program-erase cycles 320. Also, the difference 301 between magnitudes 310 and 312 remains relatively constant from a first number of cycles 320 to a second number of cycles 322. According to some embodiments, the difference 301 represents a greater amount of current (or current density) available to flow through portion 200 of a memory cell of FIG. 2 over a number of cycles 324 that otherwise might not be available. A greater write or erase current facilitates increases in thickness in a tunnel oxide (not shown), which, in turn, enables miniaturization or scaled down dimensions of a memory cell.

Further, ion obstruction barrier 210 and/or the layers of CMO Type 2 204 and CMO Type 1 206 cooperate to enhance the number of program and erase cycles to extend over a first number of cycles 320 and a second number of cycles 322. For example, first number of cycles 320 can represent 10,000 cycles (10K), whereas a memory cell including portion 200 of the memory cell depicted in FIG. 2 can achieve a number of cycles 324 that is 100,000 cycles (100K). In some cases, number of cycles 324 can range from about 100,000 (100K) to about 1,000,000 cycles (1000K), or greater.

Figure 3B:
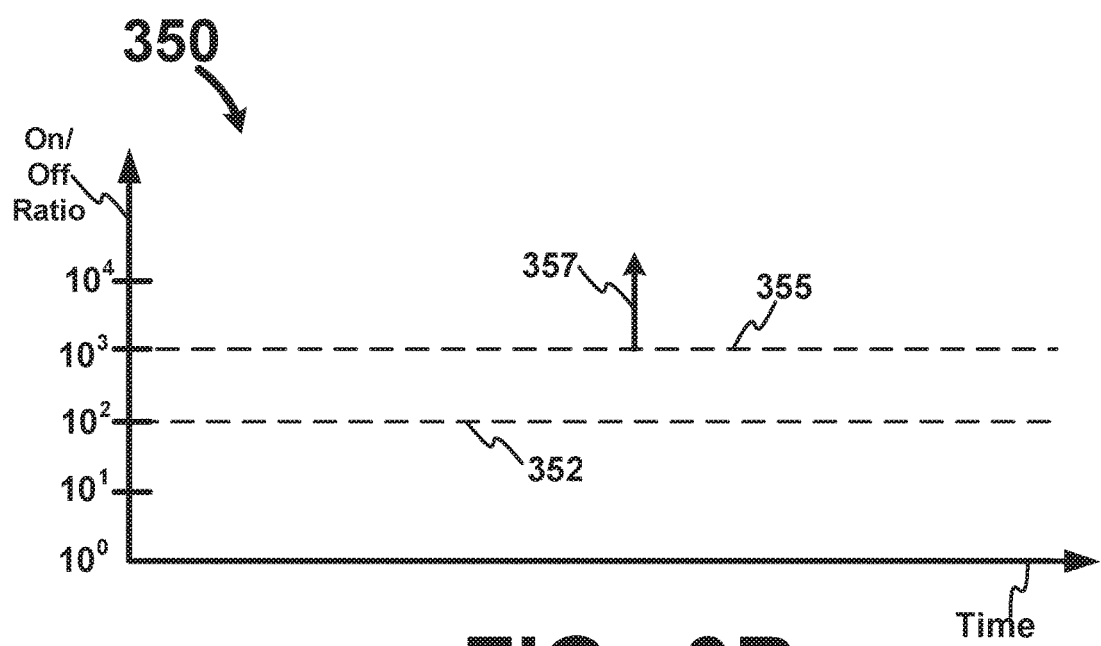

FIG. 3B is a diagram 350 illustrating an example of the on/off ratios for a memory cell including portion 200 of a memory cell of FIG. 2, according to some embodiments. As shown, ion obstruction barrier 210 and/or the layers of CMO Type 2 204 and CMO Type 1 206 of different compositions can establish an on/off ratio 352 of about two orders of magnitude ($10^2$). More preferably, an on/off ratio 355 of about three orders of magnitude ($10^3$) or greater 357 is desired. The on-off ratio is the ratio between the currents when a memory cell including portion 200 of FIG. 2 is switched on or switched off, thereby establishing a non-volatile memory effect. Another way of stating the on-off ratio is to divide a resistance value of a low resistance state (e.g., a high current erased state) by a resistance value of the highest resistant state (e.g., a low current programmed state). For the same magnitude of read voltage applied across the electrodes (208, 209) the read current will be low when the memory element 205 stores data in the programmed high resistance state and the read current will be higher when the memory element 205 stores data in the erased low resistance state. In that it is easier to measure or sense read current than it is to measure or sense resistance, on/off ratios based on current are typically used because the magnitude of the current is a function of the resistance value stored in the memory element 205. The memory effect of a memory cell including memory element 205 can increase to greater than about 10 to about 100 times than otherwise might be the case when either ion obstruction barrier 210 or the layers of CMO Type 2 204 and CMO 206 of different compositions, or both, are absent. According to some alternate embodiments, on/off ratio 352 can be greater than three orders of magnitude. In view of the above, ion obstruction barrier 210 and/or the layers of CMO Type 2 204 and CMO Type 1 206 of FIG. 2 can cooperate to enhance the reliability of memory cells that include memory element 205.

Returning back to FIG. 2, a grain orientation of the material of an electrode, such as electrode 208 can facilitate the crystalline structures of layer of CMO Type 1 material 206 and/or layer of CMO Type 2 Material 204, according to some embodiments. Electrodes 208 and 209 can be formed from an electrically conductive material, such as a metal (e.g., a noble metal or a combination of noble metals). In a specific example, electrodes 208 and 209 can be formed of platinum (Pt) and may be deposited to a thickness of, for example, from about 50 Angstroms to about 1250 Angstroms. In other embodiments, electrodes 208 and 209 can be formed from a conductive metal oxide (CMO), a doped CMO, or from a metal or metal alloy that has been completely or partially oxidized. Actual thicknesses for electrodes 208 and 209 will be application specific and are not limited to the examples set forth herein.

IMO material 202 can include a material to form a tunnel oxide-based structure or an electrolytic tunnel barrier. In various embodiments, the IMO 202 can include but is not limited to a material for implementing a tunnel barrier layer is also an electrolyte that is permeable to the mobile oxygen ions 207 at voltages for write operations. Suitable materials for IMO 202 include but are not limited to one or more of the following: high-k dielectric materials, rare earth oxides, rare earth metal oxides, yttria-stabilized zirconium (YSZ), zirconia ($ZrO_x$), zirconium oxygen nitride (ZrOxNy), yttrium oxide ($YO_x$), erbium oxide ($ErO_x$), gadolinium oxide ($GdO_x$), lanthanum aluminum oxide ($LaAlO_x$), hafnium oxide ($HfO_x$), aluminum oxide (AlOx), silicon oxide (SiOx), cerium oxide ($CeO_x$), gadolinium doped cerium oxide ($CeO_x$), titanium oxide (TiOx), tantalum oxide (TaOx), and equivalent materials. IMO material 202 can have a thickness of approximately 50 Angstroms or less. Actual IMO thickness will be application specific and can be a function of the material selected and voltage magnitudes chosen for data operations to memory cells (e.g., read voltages, write voltages, program and erase voltages) that facilitate electron tunneling.

CMO Type 1 material 206 and CMO Type 2 material 204 can include different compositions of conductive metal oxide (CMO) or other perovskite material that typically exhibits memory characteristics. CMOs can be formed from a variety of perovskite materials and may include a mixed valence conductive oxide having substantially mixed crystalline or polycrystalline perovskite structure. Perovskite materials, such as CMO, may include two or more metals being selected from a group of transition metals, alkaline earth metals and rare earth metals. Examples of other perovskite materials may include, but are not limited to, manganites, titanates (e.g., strontium titanate STO, reduced STO), zirconates (SZO:Cr, CNO:Cr, TaO:Cr), LSCO, and high Tc superconductors (e.g., YBCO). Other examples of perovskites include but are not limited to $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), and $LaSrFeO_x$ (LSFeO), where x is nominally 3 for perovskites (e.g., x≤3 for perovskites) or the one or more CMO layers can be a conductive binary metal oxide structure comprised of a conductive binary metal oxide having the form $A_xO_y$, where A represents a metal and O represents oxygen. The conductive binary oxide material may optionally be doped (e.g., with niobium Nb, fluorine F, and/or nitrogen N) to obtain the desired conductive properties for a CMO. Other suitable CMO materials are described in U.S. patent application Ser. No. 12/653,836, filed Dec. 18, 2009, and published as U.S. publication no. 2010/0157658, and titled "Conductive Metal Oxide Structures In Non-Volatile Re-Writable Memory Devices", already incorporated herein by reference. Layers of CMO Type 1 material 206 and CMO Type 2 material 204 can include two or more layers of CMO materials, at least two of which comprise CMO material of different compositions. Regardless, a CMO layer adjacent to and in contact with IMO layer 202 is thinner than other CMO layers. For example, layer of CMO Type 2 material 204, which is adjacent layer of IMO 202, can be formed to have a thickness between about 10% and about 20% of the thickness of CMO Type 1 material 206, according to some embodiments.

According to various embodiments, memory element 205 is a resistive memory element configured to maintain a resistive state representative of a data stored therein. Stored data is retained in the absence of electrical power (i.e., is non-volatile). As used herein, the term "discrete memory element" can refer, at least in some examples, to a memory cell having a structure that includes no more than memory element 205, and electrodes 208 and 209. For example, a discrete memory element can be a gateless two-terminal device. Examples of a non-discrete memory cell and/or memory element include but are not limited to one or more transistors or diodes configured to implement a selection device (SD) such as a non-ohmic device (NOD) or the like.

Typical variations include 1T1R, 2T1R, 1D1R, and 2D1R devices where one (1T) or two (2T) transistors or one (1D) or two (2D) diodes are included in the memory cell and electrically coupled with the memory element.

Memory element 205 can as a discrete memory element constitute a memory cell, according to at least some embodiments. In some examples, a programmed state is a high resistance state (e.g., a logic "0"), and an erased state is a low resistance state (e.g., a logic "1"), thereby establishing a magnitude of an access current that is relatively lower for the programmed state and is relatively higher for the erased state. When only two resistive states are stored, the memory cell can be referred to as a single level cell (SLC). A range of resistive states (e.g., two-bits as "00", "01", "10", or "11") can represent more than two memory states (i.e., multiple bits per memory cell can be stored as a multi-level cell—MLC).

Note that in alternate embodiments, other materials and layers can be disposed between those structures shown in FIG. 2. While the term "bottom electrode" can refer to an electrode that is formed closer to a substrate (not shown) than other electrodes, the description of structures and techniques relating to a bottom electrode can apply to a top electrode.

Figure 4:
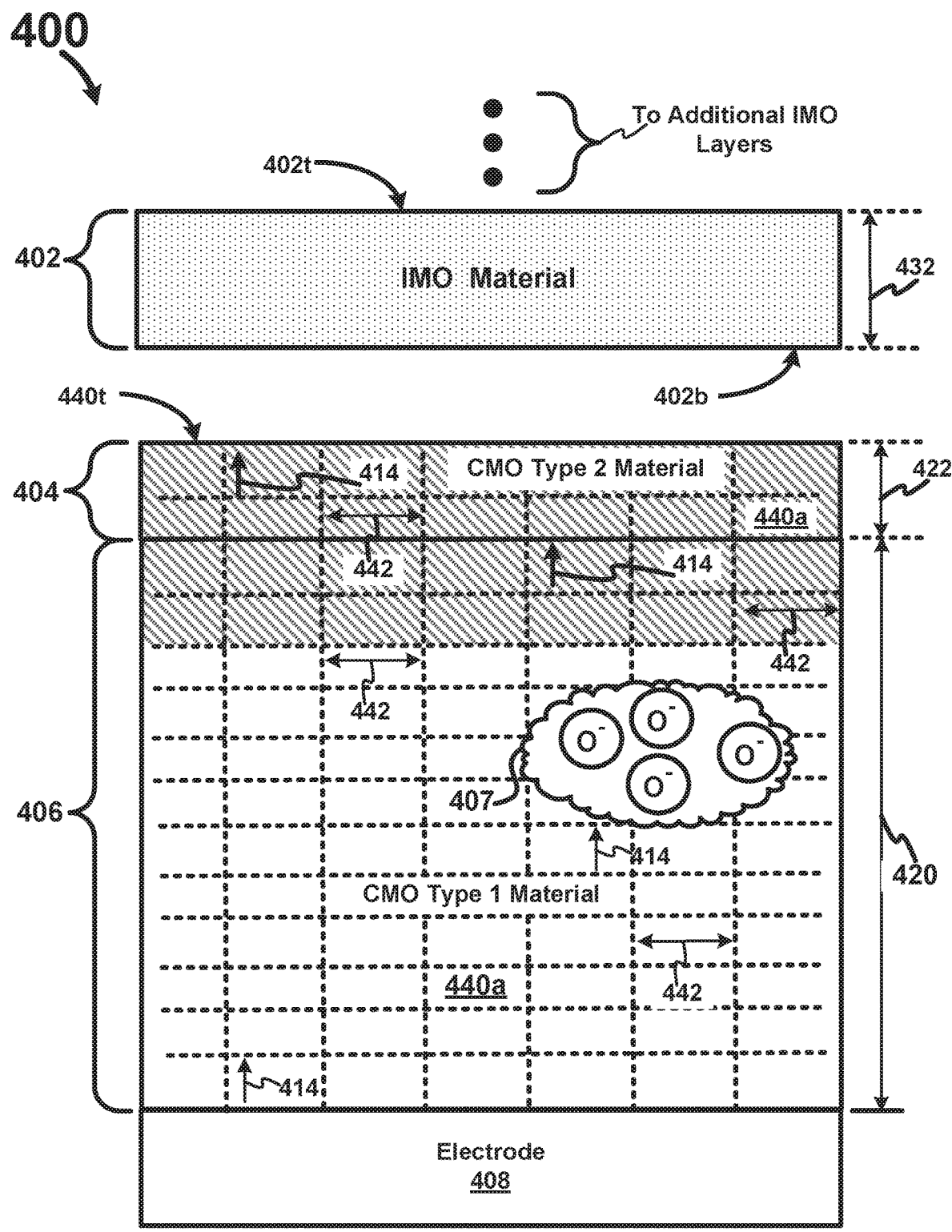
FIG. 4 depicts an example of a cross-sectional view of a memory element, according to various embodiments.

FIG. 4 illustrates a memory element in accordance with some embodiments. As shown, a memory element 400 includes, but is not limited to, including a layer of insulating metal oxide (IMO) 402 formed on multiple layers of conductive metal oxide (CMO), which is depicted as including a layer of CMO Type 2 Material 404 formed on a layer of CMO Type 1 material 406. Memory element 400 is formed on electrode 408. In this example, the materials in layer of CMO Type 2 Material 404 and layer of CMO Type 1 material 406 have different compositions. At least one of layer of CMO Type 1 material 406 and layer of CMO Type 2 Material 404 can include an atomic layer deposited (ALD) layer of material or a plasma enhanced atomic layer deposited (PEALD) layer of material. Here, deposition of one or more of the CMO layers may occur in whole or in part using ALD or PEALD. In other embodiments, one or more of the CMO layers may be deposited in whole or in part using a nano-deposition process. Note that the layers of CMO provide mobile oxygen ions 407 for ion transport when various electric fields are applied across electrodes 408 and 409 (e.g., from an external source as described in regard to FIG. 2). Further, layer of CMO Type 2 Material 404 and a portion of layer of CMO Type 1 material 406 include an ion-implanted material. The ion-implanted material is disposed within the crystalline structures of the different compositions of layers 404 and 406 to form an ion obstruction barrier.

CMO Type 1 material 406 can be formed from relatively large-sized grains in relatively crystalline structures, whereas CMO Type 2 material 404 can be formed from relatively fine-sized grains in relatively irregular crystalline structures. According to various embodiments, layer of CMO Type 1 material 406 is formed with grains 440b having an orientation 414 and a grain size 442. CMO Type 2 material 404 is deposited as a layer in which grains 440a adopt similar grain orientations 414 and grain dimensions or sizes 442 from layer of CMO Type 1 material 406 (e.g., grain size and grain orientation are replicated or mimicked in CMO Type 2 material 404). Here, replication of the grain size and/or grain orientation in CMO Type 2 material 404 may be identical to or substantially identical to the grain size and/or grain orientation in CMO Type 1 material 406. In some embodiments, CMO Type 2 material 404 may be formed first followed by CMO Type 1 material 406 being formed on layer 404. The replication of the grain size and/or grain orientation in CMO Type 1 material 406 may be identical to or substantially identical to the grain size and/or grain orientation in CMO Type 2 material 404 (see FIG. 9B) upon which layer 406 is formed. Therefore, replication is from layer 404 to layer 406. According to some embodiments, layer of CMO Type 1 material 406 is formed to have a thickness 420 from about 50 to about 250 Angstroms, and layer of CMO Type 2 material 404 is formed to have a thickness 422 from about 5 to about 25 Angstroms. As another example, layer of CMO Type 2 material 404 can be formed to have a thickness 422 from about 10 to about 20 Angstroms. IMO 402 has a thickness 432 that is approximately 50 Angstroms or less. For example, thickness 432 can be 27 Angstroms. Actual thicknesses for 420 and 422 will be application specific and are not limited to the examples set forth herein. Although IMO 402 is depicted not connected with CMO Type 2 material 404 for purposes of illustration, in actuality an upper surface 440t and a bottom surface 402b will be in direct contact with each other.

Although only one layer of IMO material 402 is depicted, the present invention is not limited to a single layer of IMO and additional IMO layers may be formed in contact with one another and having a combined thickness that is approximately 50 Angstroms or less. A memory element including multiple IMO layers (i.e., at least two IMO layers) their composition, and formation is described in U.S. patent application Ser. No. 13/250,772, filed Sep. 30, 2011, and titled "Memory Device Using Multiple Tunnel Oxide Layers", already incorporated herein by reference.

Figure 5A:
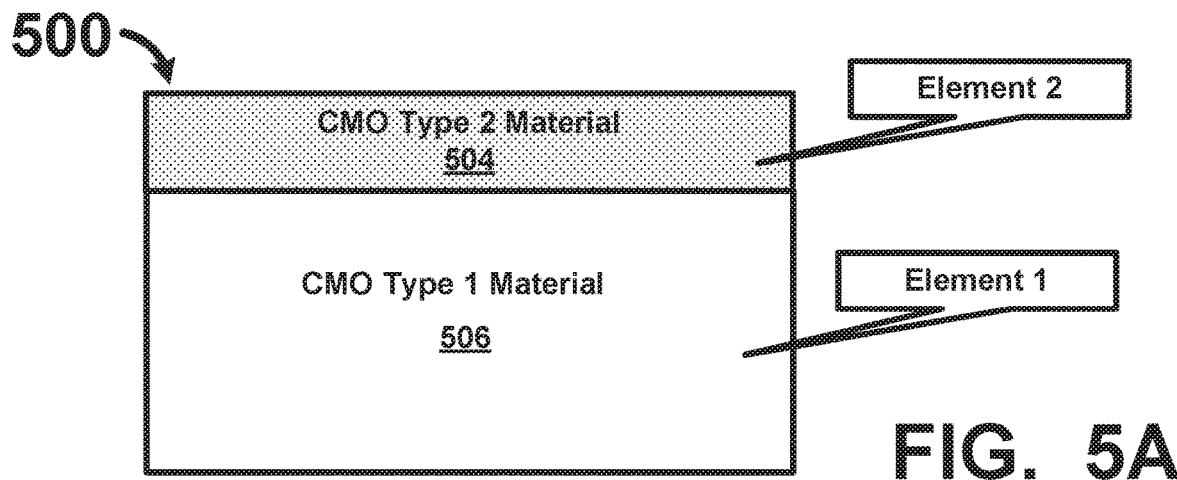
FIGS. 5A to 5C depict examples of various multi-layer CMO structures having different compositions, according to various embodiments.
Figure 5B:
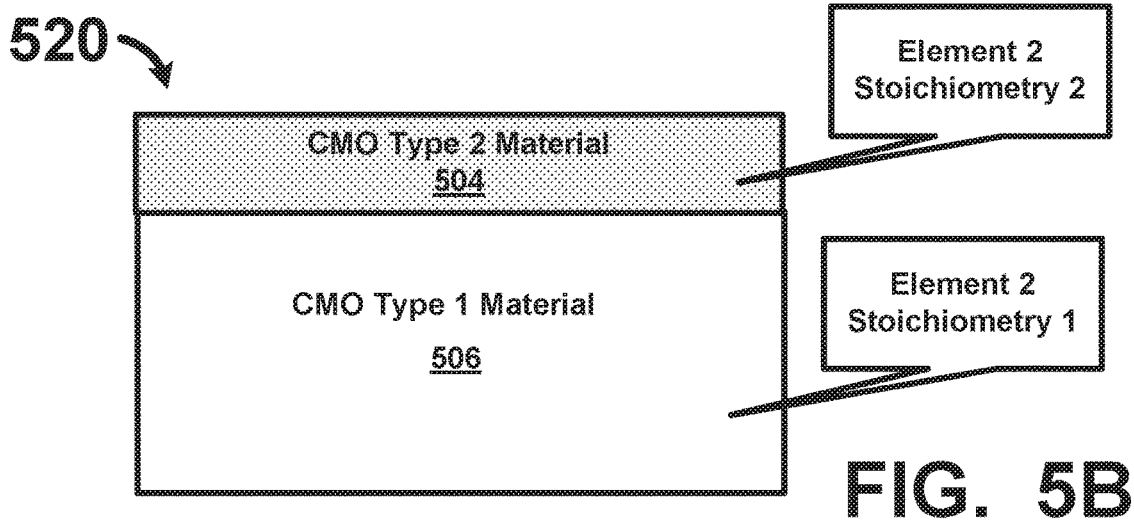
Figure 5C:
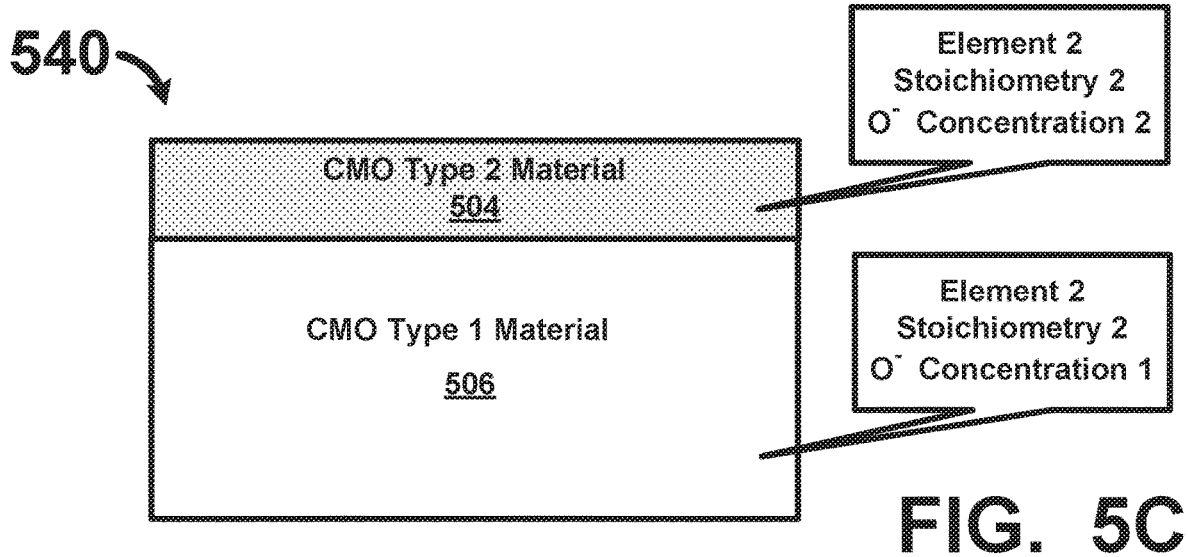

FIGS. 5A to 5C illustrate various multi-layer CMO structures having different compositions, according to various embodiments. Layers of CMO Type 1 material 506 and CMO Type 2 material 504 include different compositions, such as different elements, different stoichiometries, and different concentrations of oxygen ions. FIG. 5A depicts a dual-layers CMO structure 500 whereby layers of CMO Type 1 material 506 and CMO Type 2 material 504 have different compositions due to implementations of different elements (e.g., Element 1 and Element 2). FIG. 5B depicts a dual-layers CMO structure 520 whereby layers of CMO Type 1 material 506 and CMO Type 2 material 504 have different compositions due to implementations of different stoichiometries (e.g., Stoichiometry 1 and Stoichiometry 2), whereas the compositions have identical elements. FIG. 5C depicts a dual-layers CMO structure 540 whereby layers of CMO Type 1 material 506 and CMO Type 2 material 504 have different compositions due to implementations of different concentrations or diffusion rates of mobile oxygen ions (e.g., $O^-$ concentration 1 and $O^+$ concentration 2), whereas the compositions have identical elements and identical stoichiometries.

Figure 6:
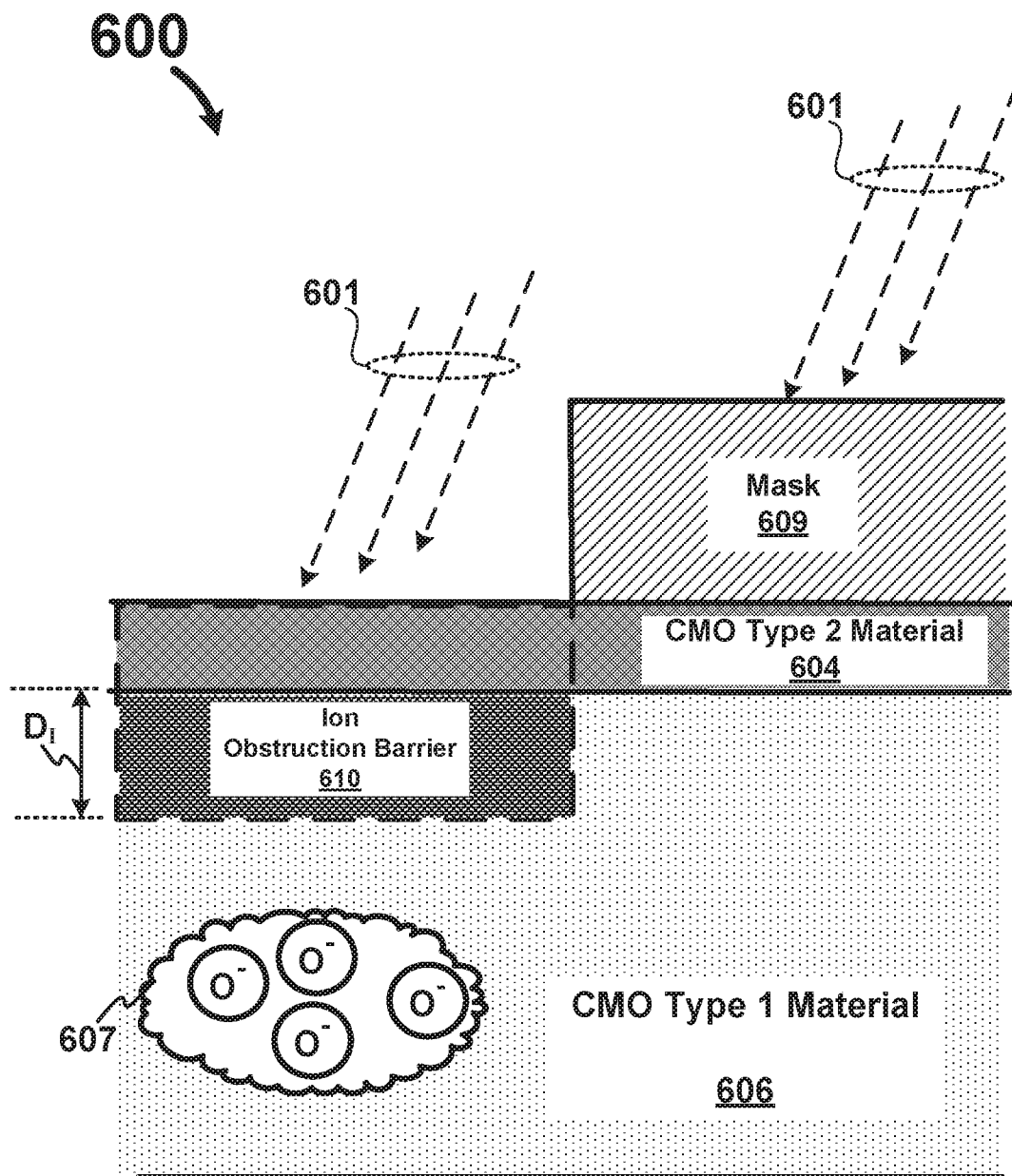
FIG. 6 is a diagram depicting an example of formation of an ion obstruction barrier for a two-terminal resistive memory element, according to various embodiments.

FIG. 6 is a diagram 600 depicting formation of an ion obstruction barrier for a two-terminal resistive memory element, according to various embodiments. While not shown, an electrode can be formed upon which a layer of CMO Type 1 material 606 is formed. Layer of CMO Type 1 material 606 can serve as a reservoir for mobile oxygen ions 607. Layer of CMO Type 2 material 604 can be formed to have similar crystalline structures, including similar orientations and/or dimensions to layer of CMO Type 1 material 606. Next, a mask 609 can optionally be used to expose portions of layer of CMO Type 2 material 604 to the environs. One or more elements 601 can be implanted via ion implantation techniques at an implantation depth $D_\Box$ through layer of CMO Type 2 material 604 to reach a portion of layer of CMO Type 1 material 606 to form an "active region" as ion obstruction barrier 610. Examples of elements 601 include argon and other suitable elements. Ion obstruction barrier 610 is configured to inhibit transport or diffusion of other mobile ions (not shown) between layer of CMO Type 1 material 606 and a layer of insulating metal oxide (IMO), which is not shown. The term active region, according to some embodiments, can refer to an ion obstruction barrier. Other mobile ions may refer to ions other than the mobile oxygen ions 607, such as metal ions, for example.

Figure 7A:
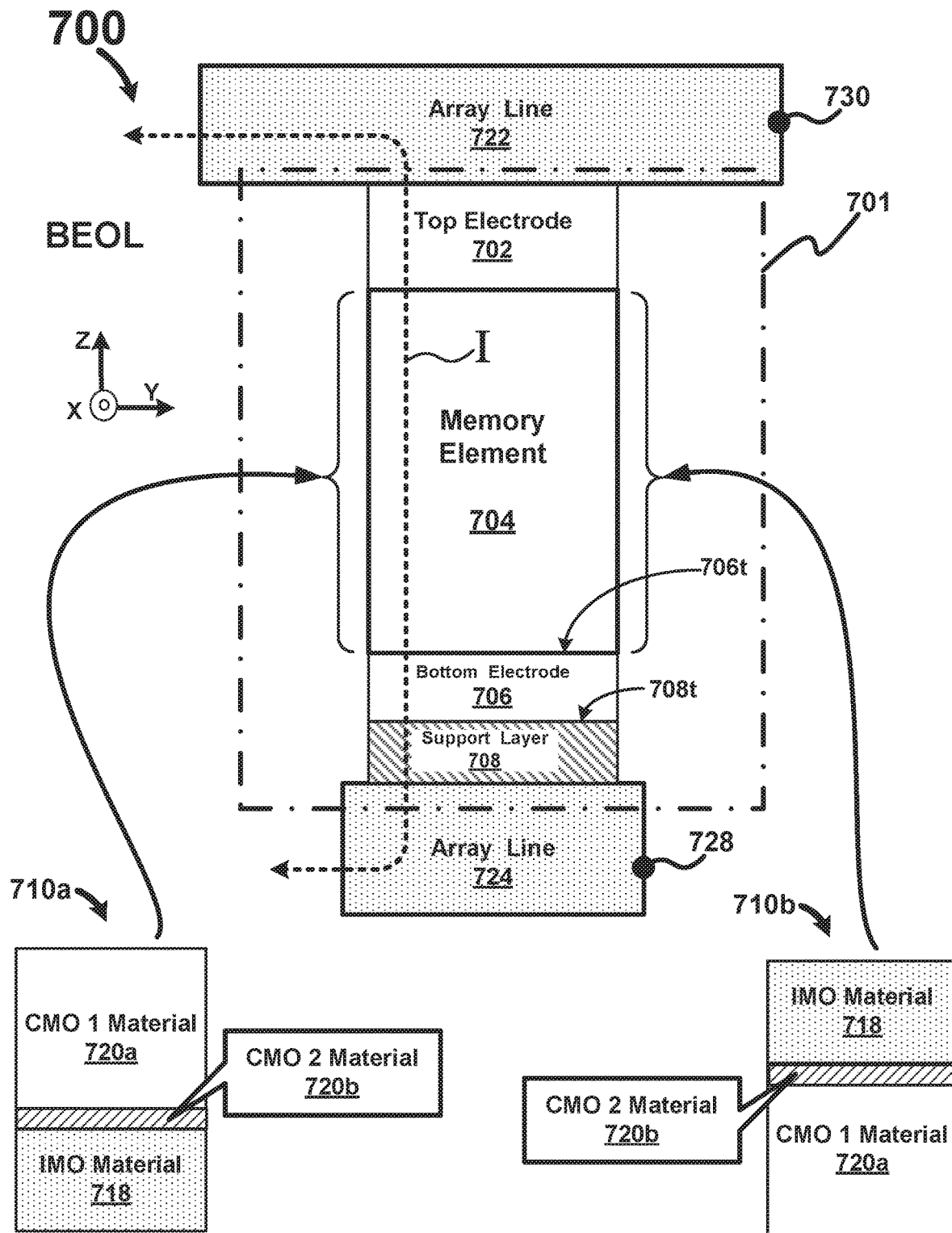
FIG. 7A depicts an example of a cross-sectional view for a configuration including a memory cell in accordance with various embodiments.

FIG. 7A illustrates a configuration including a memory cell in accordance with various embodiments. In configuration 700, a memory cell 701 includes a top electrode 702, a memory element 704, and a bottom electrode 706, which can be formed on an optional support layer 708. Support layer 708 can influence the structure and/or functionality of IMO material 718. In some embodiments, support layer 708 is configured to facilitate formation of IMO material 718 with a uniform thickness or a substantially uniform thickness. Support layer 708 can serve as a "template" (e.g., a growth template) to promote the formation of bottom electrode 706 in a manner that propagates the smoothness of a substantially planar upper surface 708t of support layer 708 to an upper surface 706t of bottom electrode 706, thereby providing for a smooth surface or a substantially smooth upper surface 706t of bottom electrode 706 to establish a relatively smooth interface between CMO 2 Material 720b and IMO material 718, or other layers of the memory element 704. Memory cell 701 also includes portions of array line 722 and array line 724 as terminals. Array line 722 and array line 724 may be the conductive array lines of a cross-point array with memory cell 701 positioned between a cross-point of its respective pair of conductive array lines (722, 724) and electrically in series with its respective pair of conductive array lines. In configuration 700, support layer 708 is made from an electrically conductive material such that a current I can flow thorough the memory cell 701 and memory element 704 during data operations (e.g., a read current) on the memory element 704 when appropriate voltage potentials (e.g., write voltages or read voltages) are applied to nodes 728 and 730. As such, memory cell 701 and memory element 704 can be two-terminal memory structures. Memory element 704 is shown to include, but is not limited to, structures 710a and 710b. Memory element structure 710a includes a first substructure including IMO material 718, upon which a second substructure including multiple layers of CMO materials 720a and 720b is formed. Memory element structure 710b includes a first substructure including multiple layers of CMO materials 720a and 720b, upon which a second substructure including IMO material 718 is formed. Memory element 704 can include different and/or additional structures. Multiple layers of CMO materials 720a and 720b in substructures 710a and 710b include ion obstruction barriers (not shown) as described above.

Figure 7B:
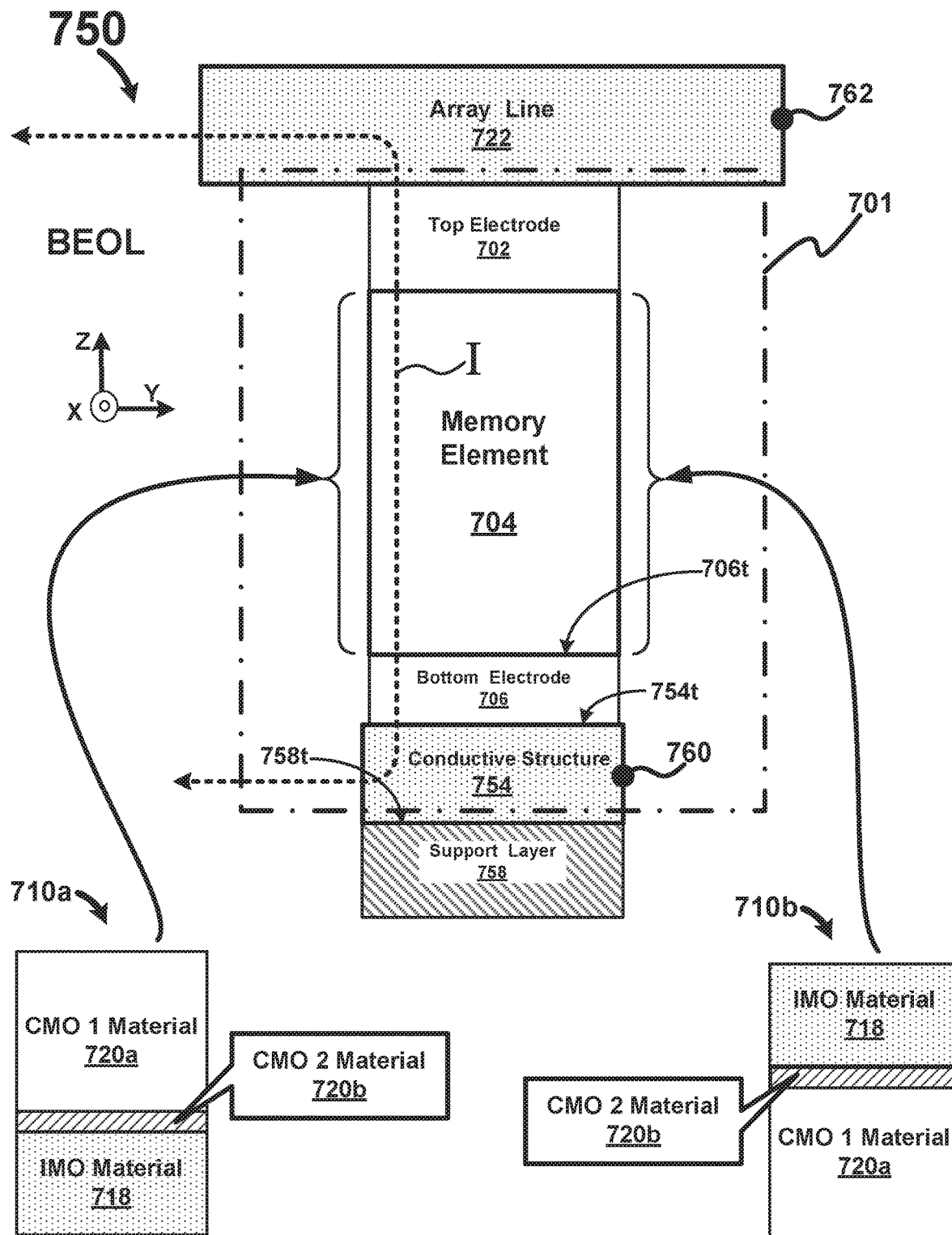
FIG. 7B depicts an example of a cross-sectional view of another configuration including a memory cell, according to various embodiments.

FIG. 7B illustrates another configuration including a memory cell in accordance with various embodiments. In configuration 750, a memory cell 701 includes a top electrode 702, a memory element 704, and a bottom electrode 706, a conductive structure 754 (e.g., an array line) which can be formed on an optional support layer 758. Support layer 758 can influence the structure and/or functionality of IMO material 718. In some embodiments, support layer 758 is configured to facilitate formation of IMO material 718 with a uniform thickness or a substantially uniform thickness. Support layer 758 can serve as a "template" (e.g., a growth template) to promote the formation of conductive structure 754 and subsequent layers formed above the conductive structure 754 in a manner that propagates the smoothness of a substantially planar upper surface 758t of support layer 708 to upper surfaces 754t and 706t of the conductive structure 754 and bottom electrode 706, respectively, thereby providing for a smooth surface or a substantially smooth upper surface 706t of bottom electrode 706 to establish a relatively smooth interface between CMO 2 Material 720b and IMO material 718, or other layers of memory element 704. Memory cell 701 also includes portions of array line 722 and array line 724 as terminals. Array line 722 and array line 724 may be the conductive array lines of a cross-point array with memory cell 701 positioned between a cross-point of its respective pair of conductive array lines (722, 724) and electrically in series with its respective pair of conductive array lines. In configuration 700, support layer 758 is made from an electrically non-conductive material. Here, a current I can flow thorough the memory cell 701 and memory element 704 during data operations (e.g., a read current) on the memory element 704 when appropriate voltage potentials (e.g., write voltages or read voltages) are applied to nodes 760 and 762. Unlike, configuration 700 of FIG. 7A, current I does not flow through support layer 758 because it is electrically non-conductive. As such, memory cell 701 and memory element 704 can be two-terminal memory structures. Memory element 704 is shown to include, but is not limited to, structures 710a and 710b. Memory element structure 710a includes a first substructure including IMO material 718, upon which a second substructure including multiple layers of CMO materials 720a and 720b is formed. Memory element structure 710b includes a first substructure including multiple layers of CMO materials 720a and 720b, upon which a second substructure including IMO material 718 is formed. Memory element 704 can include different and/or additional structures. Multiple layers of CMO materials 720a and 720b in substructures 710a and 710b include ion obstruction barriers (not shown) as described above.

Figure 8:
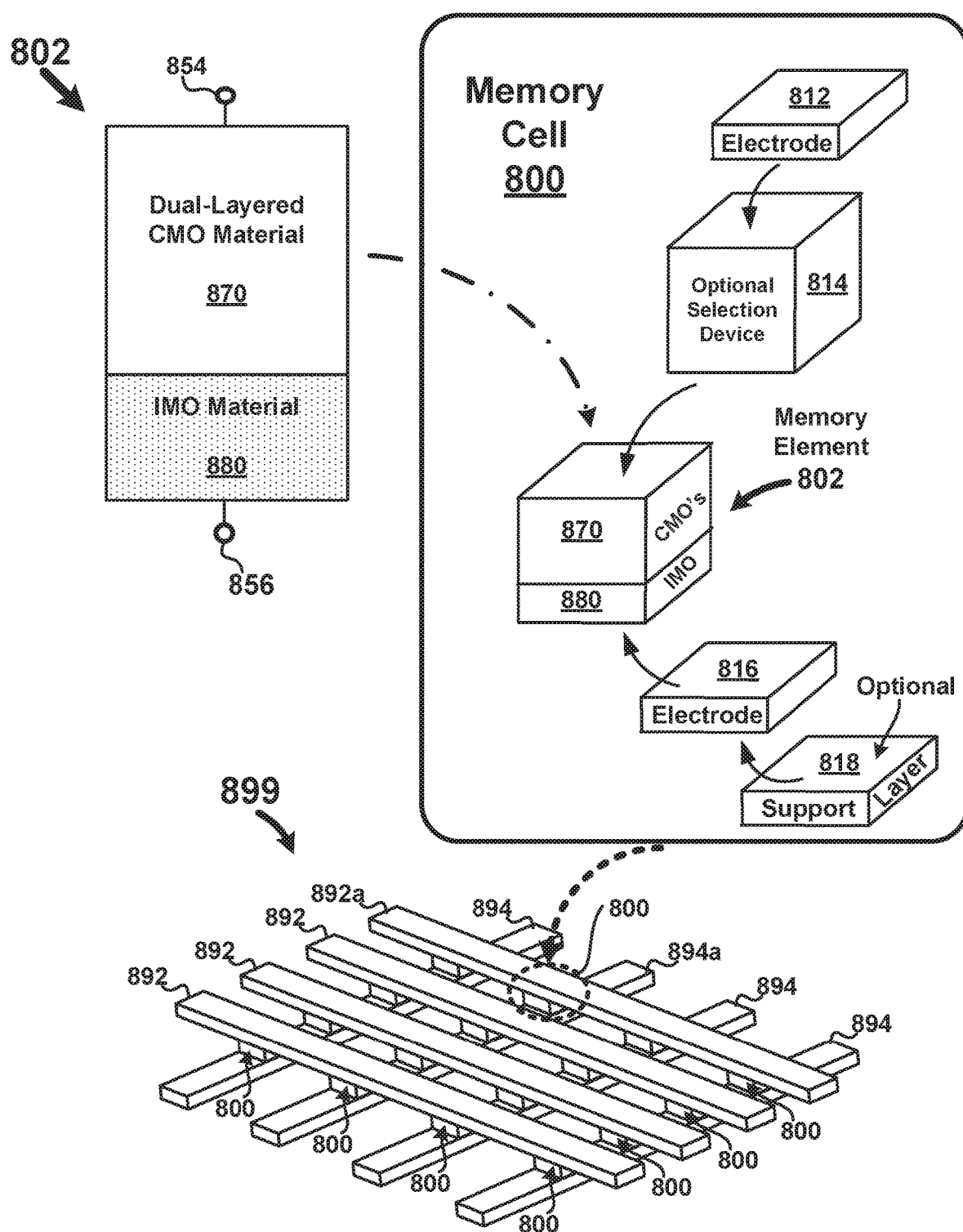
FIG. 8 depicts an example of components of a memory element and arrayed memory cells, according to various embodiments.

FIG. 8 depicts an example of arrayed memory cells according to various embodiments. In this example, a memory cell 800 includes a memory element 802, which, in turn, includes dual-layered CMO material 870 including different compositions and IMO material 880. Memory cell 800 further includes two terminals 854 and 856. Terminals 854 and 856 can be electrically coupled with or can be formed as electrodes 812 and 816. The electrodes (812, 816) can be made from an electrically conductive material including but not limited to, platinum (Pt), gold (Au), silver (Ag), iridium (Ir), iridium oxide ($IrO_x$), ruthenium (Ru), palladium (Pd), aluminum (Al), alloys of those materials, combinations of those materials, and the like. Optionally, memory cell 800 can include a support layer 818, upon which electrode 816, or some other layer is formed. As described above in regards to FIGS. 7A and 7B, the support layer 818 may or may not be electrically conductive.

In at least some embodiments, memory cell 800 can include optionally a selection device (SD) (e.g., a NOD) 814, which, in turn, can be formed on the memory element 802 (e.g., either above or below memory element 802). SD 814 can be a "metal-insulator-metal" (MIM) type structure that includes one or more layers of electronically insulating material that are in contact with one another and sandwiched between metal layers (e.g., electrodes), or SD 814 can be a non-linear device (e.g., one or more diodes or one or more transistors). U.S. Pat. No. 7,995,371, issued on Aug. 9, 2011, and titled "Threshold Device For A Memory Array and U.S. Pat. No. 7,884,349, issued on Feb. 8, 2011, and titled "Selection Device for Re-Writable Memory", both of which are already incorporated herein by reference. Memory cell 800 can be formed between conductive array lines, such as array lines 892 and 894. Thus, memory cell 800 can be formed in an array with other memory cells, and the array can be a cross-point array 899 with groups of conductive array lines 892 and 894. For example, array line 892a can be electrically coupled with the electrode 812 of the memory cells 800 and/or may be in contact with a surface of the electrode 812. Array line 894a can be electrically coupled via support layer 818 with the electrode 816 of the memory cells 800 and/or may be in contact via support layer 818 with a surface of electrode 816.

Figure 9A:
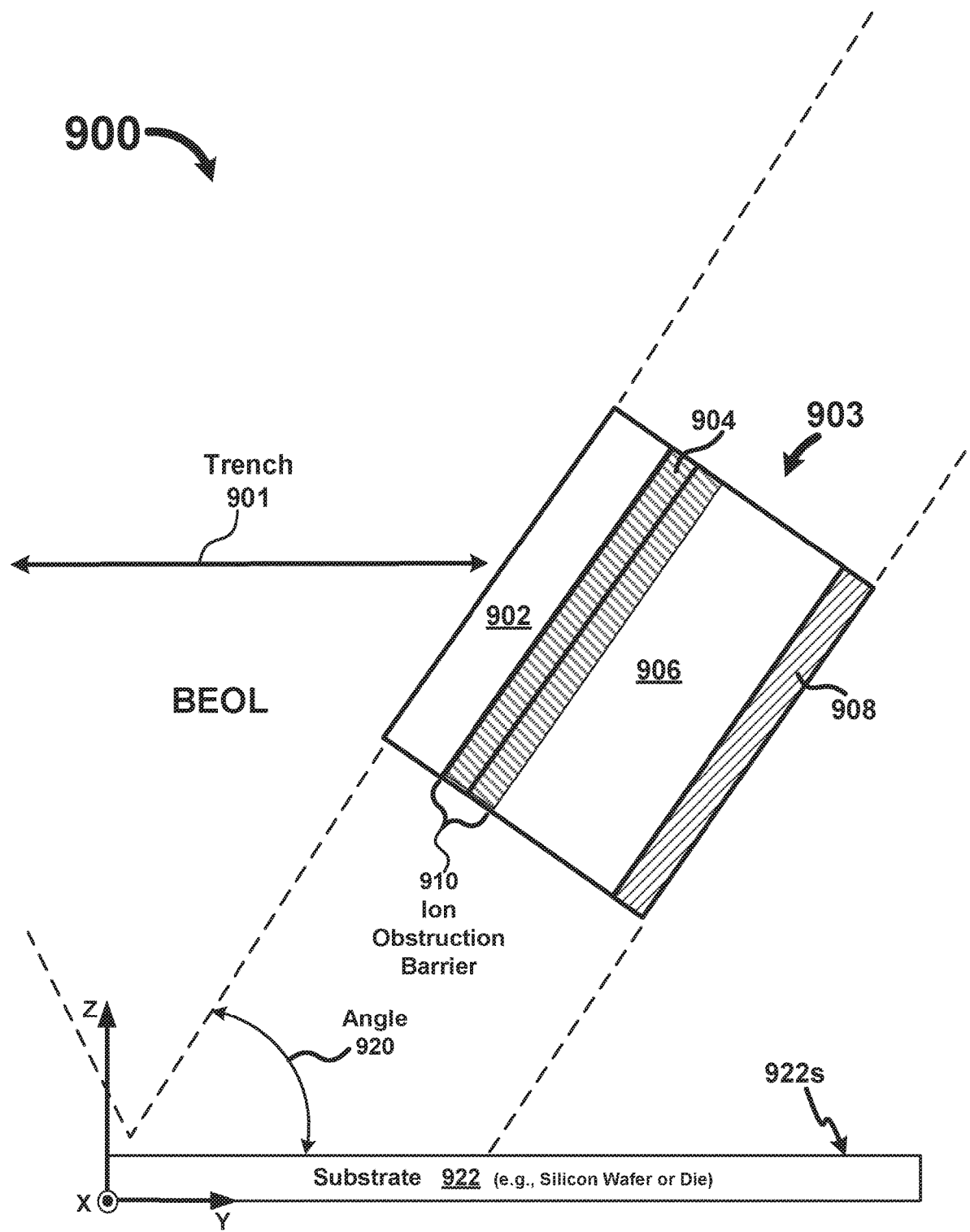
FIG. 9A depicts a cross-sectional view of an example of a memory element oriented at an angle with a substrate, according to various embodiments.

FIG. 9A depicts an example of a memory element oriented at an angle with a substrate, according to various embodiments. Diagram 900 depicts a memory element 903 including a layer of insulating metal oxide (IMO) 902 formed on multiple layers of conductive metal oxide (CMO), which is depicted as including a layer of CMO Type 2 Material 904 formed on a layer of CMO Type 1 material 906. In this example, the materials in layer of CMO Type 2 Material 904 and layer of CMO Type 1 material 906 have different compositions. Layer of CMO Type 1 material 906 is formed on electrode 908. Further, multiple layers of CMO Type 1 material 906 and CMO Type 2 Material 904 include an ion obstruction barrier 910. In this example, memory element 903 is formed in a trench 901 with surfaces of layer of CMO Type 2 Material 904 and layer of IMO 902 being oriented at an angle 920 relative to substrate surface 922 (e.g., a FEOL silicon substrate with active circuitry). Structures (e.g., memory element 903) above an upper surface 922s can be formed BEOL above substrate 922. Other orientations are possible.

Figure 9B:
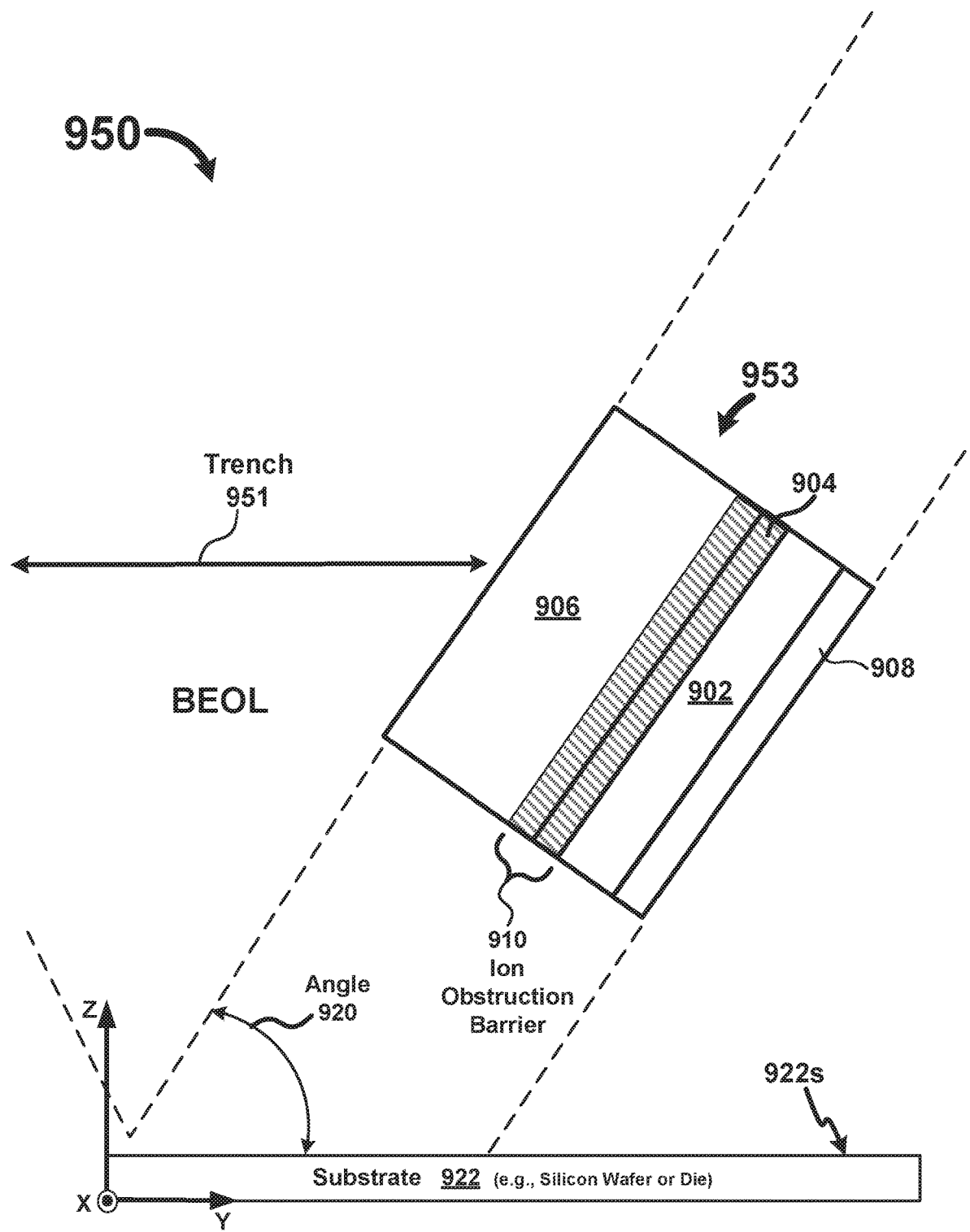
FIG. 9B depicts a cross-sectional view of another example of a memory element oriented at an angle with a substrate, according to various embodiments.

FIG. 9B depicts another example of a memory element oriented at an angle with a substrate, according to various embodiments. Diagram 950 depicts a memory element 953 including multiple layers of conductive metal oxide (CMO), which are depicted as including a layer of CMO Type 1 Material 906 formed on a layer of CMO Type 2 material 904, with the layer 904 formed on a layer of insulating metal oxide (IMO) 902. In this example, the materials in layer of CMO Type 2 Material 904 and layer of CMO Type 1 material 906 have different compositions. Layer of insulating metal oxide (IMO) 902 is formed on electrode 908. Further, multiple layers of CMO Type 1 material 906 and CMO Type 2 Material 904 include an ion obstruction barrier 910. In this example, memory element 953 is formed in a trench 951 with surfaces of layer of CMO Type 2 Material 904 and layer of IMO 902 being oriented at an angle 920 relative to substrate surface 922 (e.g., a FEOL silicon substrate with active circuitry). Structures (e.g., memory element 953) above an upper surface 922s can be formed BEOL above substrate 922. Other orientations are possible.

Trenches 901 and 951 of FIGS. 9A and 9B can be implemented in a vertical cross-point array configuration as described in U.S. patent application Ser. No. 13/210,292, Filed Aug. 15, 2011, and titled "Vertical Cross-Point Arrays For Ultra-High-Density Memory Applications", already incorporated by reference herein. Electrode 908 may be a common electrode shared by at least one other memory element 903 (e.g., on a common word line—WL or common bit line—BL).

Figure 10:
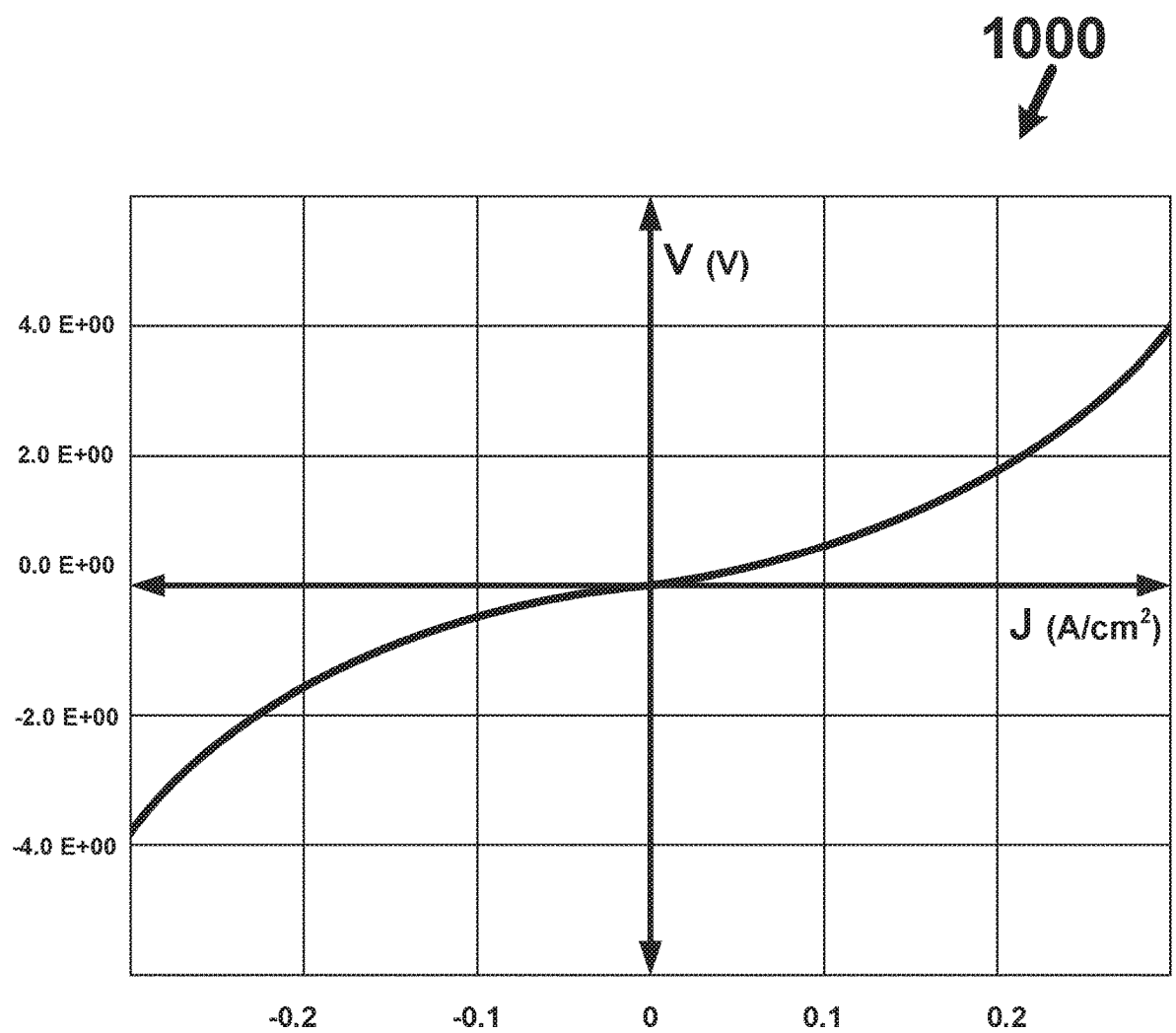
FIG. 10 depicts a graph of one example of a non-linear I-V characteristic of a discrete two-terminal memory element, according to various embodiments.

FIG. 10 graphically depicts one example of a non-linear I-V characteristic 1000 for a discrete re-writeable non-volatile two-terminal resistive memory element (e.g., 205, 704, 802, 903, 953) having integral selectivity due to its non-linear I-V characteristics and the non-linear I-V characteristic is maintained regardless of the value of the data stored in the memory cell, that is the I-V characteristic of the memory element does not change from non-linear to linear as a function of the resistive state stored in the memory element. Therefore, the non-linear I-V characteristic of the memory element is non-linear for all values of stored data (e.g., resistive states). Voltage V applied across the memory element is plotted on the Y-axis and current density J through the memory element is plotted on the X-axis. Here, current through the memory element is a non-linear function of the applied voltage across the memory element. Accordingly, when voltages for data operations (e.g., read and write voltages) are applied across the memory element, current flow through the memory element does not significantly increase until after a voltage magnitude of about 2.0V (e.g., at $\approx 0.2$ A/cm$^2$) is reached (e.g., a read voltage of about 2.0V across the memory element). An approximate doubling of the voltage magnitude to about 4.0V does not double the current flow and results in a current flow of $\approx 0.3$ A/cm$^2$. The graph depicted is only an example and actual non-linear I-V characteristics will be application dependent and will depend on factors including but not limited to an area of the memory element (e.g., area determines the current density J) and the thin-film materials used in the memory element, just to name a few. The area of the memory element will be application dependent. Here, the non-linear I-V characteristic of the discrete memory element applies to both positive and negative values of applied voltage as depicted by the non-linear I-V curves in the two quadrants of the non-linear I-V characteristic 1000. One advantage of a discrete re-writeable non-volatile two-terminal resistive memory element that has integral selectivity due to a non-linear I-V characteristic is that when the memory element is half-selected (e.g., one-half of the magnitude of a read voltage or a write voltage is applied across the memory element) during a data operation to a selected memory cell(s), the non-linear I-V characteristic is operative as an integral quasi-selection device and current flow through the memory element is reduced compared to a memory cell with a linear I-V characteristic. Therefore, a non-linear I-V characteristic can reduce data disturbs to the value of the resistive state stored in the memory element when the memory element is un-selected or is half-selected. In other embodiments, the memory element has a non-linear I-V characteristic for some values of the resistive state stored in the memory element and a linear I-V characteristic for other values of the resistive state stored in the memory element.

Thin-Film Deposition Techniques

Thin-film layers for the CMO, IMO, electrodes, or other layers for the memory element (ME) and selection device (SD) described herein can be formed using a variety of microelectronics thin-film layer deposition techniques used for nanometer and sub-nanometer device fabrication, examples of which include, but are not limited to, physical vapor deposition (PVD), sputtering, reactive sputtering, co-sputtering, chemical vapor deposition (CVD), plasma enhanced chemical vapor deposition (PECVD), nano-deposition, atomic layer deposition (ALD), plasma enhanced atomic layer deposition (PEALD), gas cluster ion beam deposition (GCIB), combinations of those techniques, and the like, just to name a few. Further, some or all of the electrode structures can be formed using a plating process, such as electroless plating, for example.

For ALD or PEALD, a thin-film layer, such as an IMO layer and/or a CMO layer can be deposited in whole using ALD or PEALD, or can be deposited in part using ALD or PEALD and some other process, such as PVD or CVD can be used to in conjunction with the ALD or PEALD to deposit the IMO and/or CMO. Therefore, the CMO layer(s) can be deposited in whole or in part using ALD or PEALD and the IMO layers can be deposited in whole or in part using ALD or PEALD. Doping of one or more of the IMO layers and/or doping of the one or more layers of CMO can also be accomplished using the above deposition techniques or combination of those techniques. Doping can occur insitu as part of the deposition process (e.g., doping ceria oxide with gadolinium during the deposition of the ceria oxide).

In some embodiments, some or all of the IMO layers or one or more of the CMO layers are deposited insitu without a chamber break. That is, if there are three layers of IMO, than some or all of those three layers can be deposited insitu in the same deposition chamber. Similarly, if there are multiple layers of CMO, then some or all of those layers can be deposited insitu in the same deposition chamber. Variations in stoichiometry in general or as a function of layer thickness can also be accomplished using the above deposition techniques and the deposition can be accomplished insitu.

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

The invention claimed is:

1. A two-terminal re-writeable non-volatile memory element comprising:
   a first conductive metal oxide (CMO) layer including mobile oxygen ions;
   a second CMO layer in contact with the first CMO layer, wherein the first CMO layer has a different concentration of mobile oxygen ions from the second CMO layer; and
   an insulating metal oxide (IMO) layer in contact with the second CMO layer.

2. The two-terminal re-writeable non-volatile memory element of claim 1, wherein the second CMO layer is configured to cooperate with the first CMO layer to form an ion obstruction barrier positioned in a portion of both the first CMO layer and the second CMO layer and to be operative to inhibit transport of other mobile ions when a voltage for data operations is not being applied across the memory element.

3. The two-terminal re-writeable non-volatile memory element of claim 2, wherein at least portions of the first CMO layer and the second CMO layer comprise an ion-implanted material operative to form the ion obstruction barrier.

4. The two-terminal re-writeable non-volatile memory element of claim 1, wherein the IMO layer is permeable to the mobile oxygen ions when a write voltage is applied across the memory element.

5. The two-terminal re-writeable non-volatile memory element of claim 1, wherein the first CMO layer has a first thickness that is greater than a second thickness of the second CMO layer.

6. The two-terminal re-writeable non-volatile memory element of claim 1, wherein the first CMO layer has a different composition than the second CMO layer.

7. The two-terminal re-writeable non-volatile memory element of claim 6, wherein the first CMO layer and the second CMO layer have substantially similar grain size and grain orientation.

8. The two-terminal re-writeable non-volatile memory element of claim 1, wherein the first CMO layer has different elements than the second CMO layer.

9. The two-terminal re-writeable non-volatile memory element of claim 1, wherein the first CMO layer has substantially similar elements but substantially different stoichiometries than the second CMO layer.

10. The two-terminal re-writeable non-volatile memory element of claim 1, wherein the first CMO layer and the second CMO layer reside in planes at an acute angle with a substrate.

11. A two-terminal re-writeable non-volatile memory cell comprising:
    a first electrode;
    a first conductive metal oxide (CMO) layer including mobile oxygen ions in contact with the first electrode;
    a second CMO layer in contact with the first CMO layer, wherein the first CMO layer has a different composition from the second CMO layer and the first CMO layer and the second CMO layer have substantially similar grain size and grain orientation;
    an insulating metal oxide (IMO) layer in contact with the second CMO layer; and
    a second electrode in contact with the IMO layer.

12. The two-terminal re-writeable non-volatile memory cell of claim 11, wherein the second CMO layer is configured to cooperate with the first CMO layer to form an ion obstruction barrier positioned in a portion of both the first CMO layer and the second CMO layer and to be operative to inhibit transport of other mobile ions when a voltage for data operations is not being applied across the first electrode and the second electrode.

13. The two-terminal re-writeable non-volatile memory cell of claim 12, wherein at least portions of the first CMO layer and the second CMO layer comprise an ion-implanted material operative to form the ion obstruction barrier.

14. The two-terminal re-writeable non-volatile memory cell of claim 11, wherein the IMO layer is permeable to the mobile oxygen ions when a write voltage is applied across the first electrode and the second electrode.

15. The two-terminal re-writeable non-volatile memory element of claim 11, wherein the first CMO layer has a first thickness that is greater than a second thickness of the second CMO layer.

16. The two-terminal re-writeable non-volatile memory element of claim 11, wherein the first CMO layer has different elements than the second CMO layer.

17. The two-terminal re-writeable non-volatile memory element of claim 11, wherein the first CMO layer has substantially similar elements but substantially different stoichiometries than the second CMO layer.

18. The two-terminal re-writeable non-volatile memory element of claim 11, wherein the first CMO layer and the second CMO layer reside in planes at an acute angle with a substrate.

19. A two-terminal re-writeable non-volatile memory element comprising:
- a first conductive metal oxide (CMO) layer including mobile oxygen ions;
- a second CMO layer in contact with the first CMO layer, wherein the first CMO layer and the second CMO layer reside in planes at an acute angle with a substrate; and
- an insulating metal oxide (IMO) layer in contact with the second CMO layer.

* * * * *